United States Patent
Kamata et al.

(10) Patent No.: US 10,861,536 B2
(45) Date of Patent: Dec. 8, 2020

(54) SEMICONDUCTOR MEMORY DEVICE

(71) Applicant: Toshiba Memory Corporation, Minato-ku (JP)

(72) Inventors: Yoshihiko Kamata, Yokohama (JP); Takuyo Kodama, Sagamihara (JP); Yuki Ishizaki, Yokohama (JP); Yoko Deguchi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/560,472

(22) Filed: Sep. 4, 2019

(65) Prior Publication Data
US 2020/0135271 A1 Apr. 30, 2020

(30) Foreign Application Priority Data
Oct. 31, 2018 (JP) ................. 2018-205000

(51) Int. Cl.
*G11C 16/26* (2006.01)
*G11C 11/56* (2006.01)
*G11C 16/24* (2006.01)
*H01L 27/11582* (2017.01)
*H01L 27/11556* (2017.01)

(52) U.S. Cl.
CPC ...... *G11C 11/5642* (2013.01); *G11C 11/5671* (2013.01); *G11C 16/24* (2013.01); *G11C 16/26* (2013.01); *H01L 27/11556* (2013.01); *H01L 27/11582* (2013.01)

(58) Field of Classification Search
CPC . G11C 16/26; G11C 11/5642; G11C 11/5671; G11C 16/24
See application file for complete search history.

(56) References Cited

U.S. PATENT DOCUMENTS

| | | | |
|---|---|---|---|
| 8,144,521 B2 | 5/2012 | Park | |
| 8,811,088 B2 | 8/2014 | Joo et al. | |
| 9,042,190 B2 | 5/2015 | Vimercati et al. | |
| 9,666,296 B1* | 5/2017 | Maejima | G11C 16/0483 |
| 2009/0168514 A1* | 7/2009 | Maejima | G11C 11/5642 |
| | | | 365/185.03 |
| 2009/0237992 A1* | 9/2009 | Maejima | G11C 16/24 |
| | | | 365/185.03 |
| 2009/0273980 A1 | 11/2009 | Doyle | |

(Continued)

FOREIGN PATENT DOCUMENTS

JP 2016-514337 A 5/2016

*Primary Examiner* — Jay W. Radke
(74) *Attorney, Agent, or Firm* — Oblon, McClelland, Maier & Neustadt, L.L.P.

(57) ABSTRACT

A semiconductor memory device includes: a first memory cell transistor; a bit line electrically connected to a first end of the first memory cell transistor; a source line electrically connected to a second end of the first memory cell transistor; and a control circuit. When a read operation for reading read data from the first memory cell transistor is performed, the control circuit is configured to apply a first voltage to the bit line in a first period, apply a second voltage, higher than the first voltage, to the bit line, and also apply a third voltage, lower than the first voltage, to the source line in a second period subsequent to the first period, and sense a threshold voltage of the first memory cell transistor in a third period subsequent to the second period.

16 Claims, 14 Drawing Sheets

(56) References Cited

U.S. PATENT DOCUMENTS

| | | | |
|---|---|---|---|
| 2009/0323432 A1* | 12/2009 | Futatsuyama | G11C 16/3454 365/185.22 |
| 2012/0163088 A1 | 6/2012 | Honda | |
| 2013/0155778 A1* | 6/2013 | Sakaguchi | G11C 16/0483 365/185.25 |
| 2013/0308389 A1 | 11/2013 | Yuh | |
| 2015/0071005 A1* | 3/2015 | Maejima | G11C 16/0483 365/185.21 |
| 2015/0098274 A1 | 4/2015 | Rhie | |

* cited by examiner

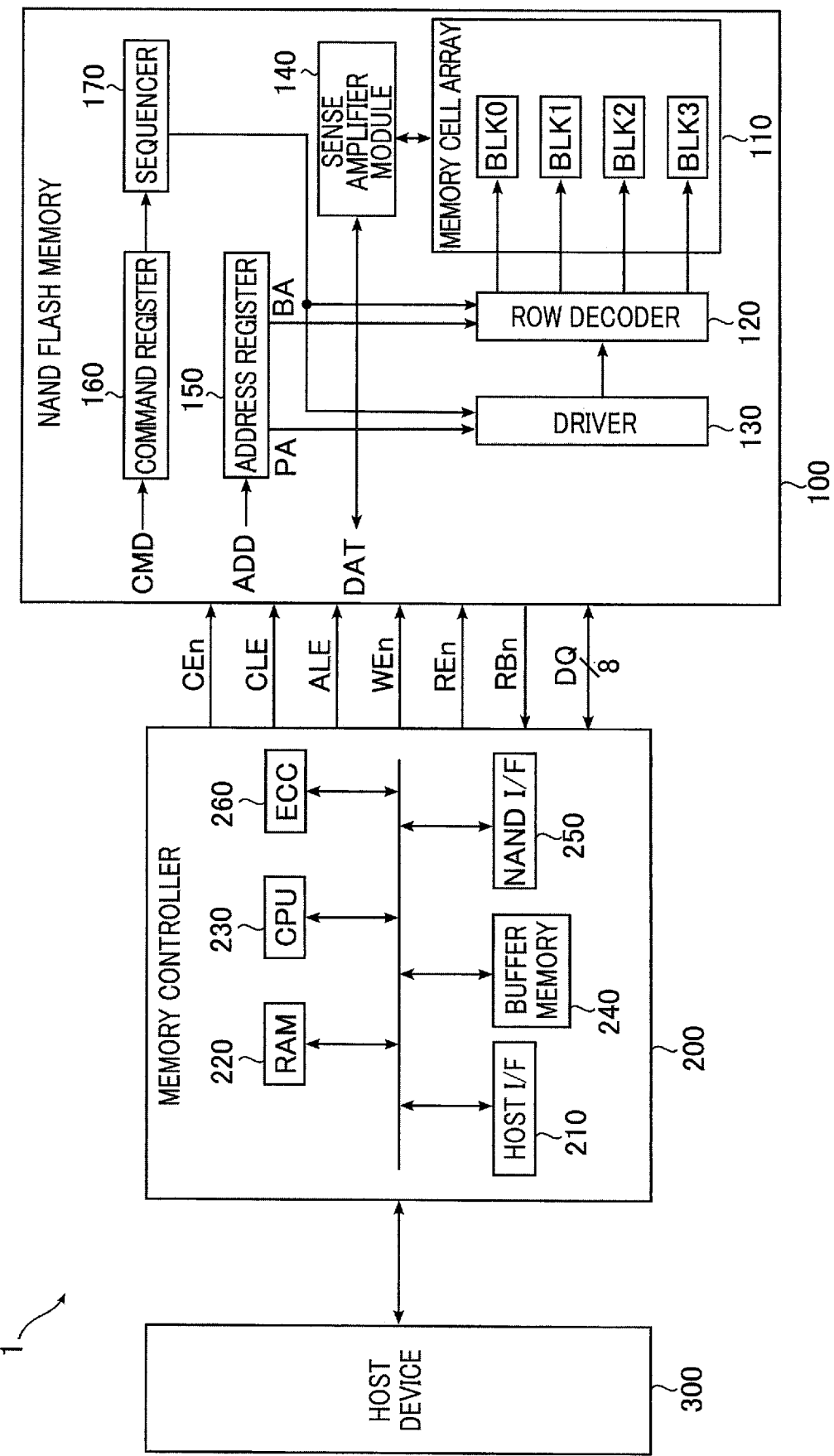
F I G. 1

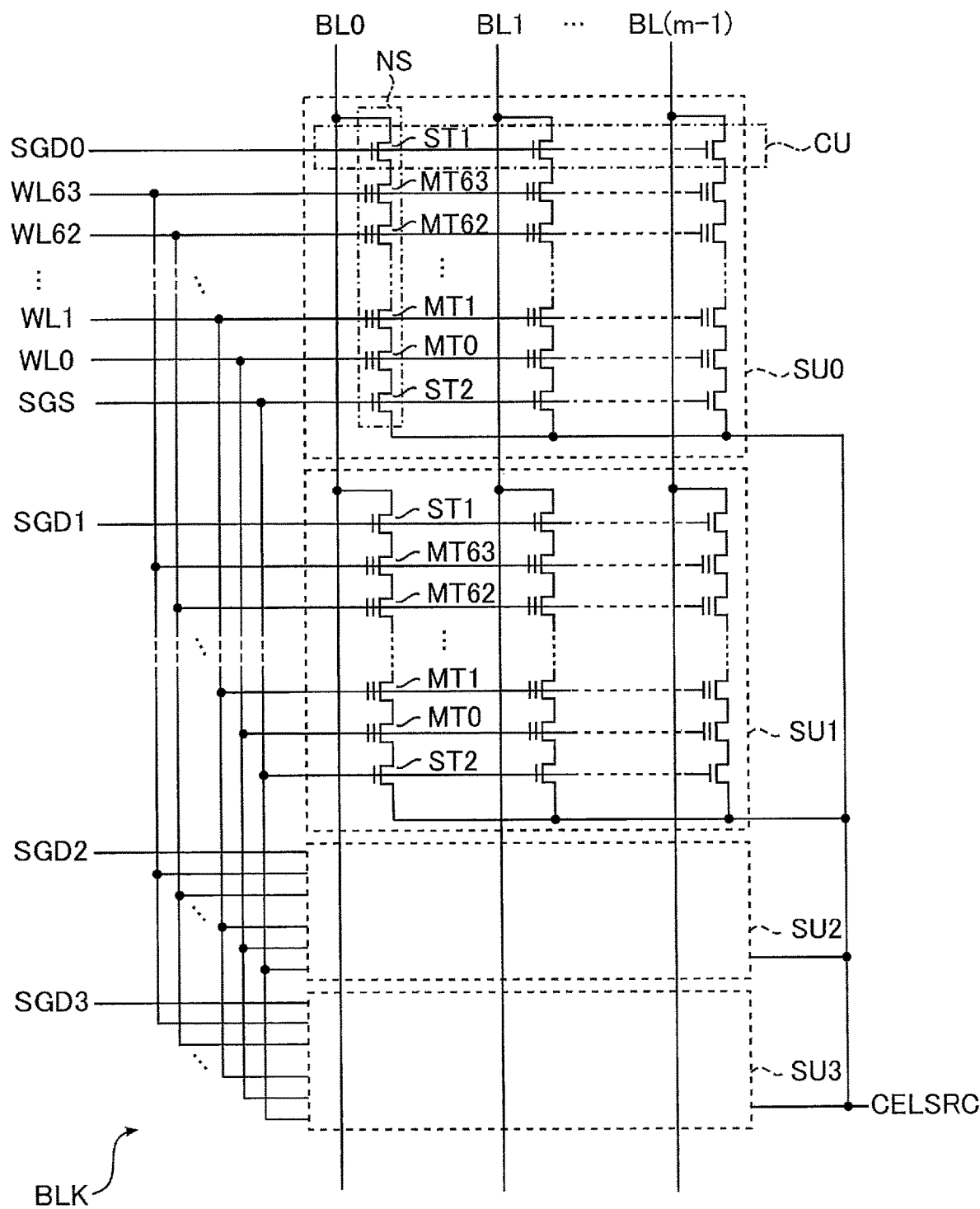
F I G. 2

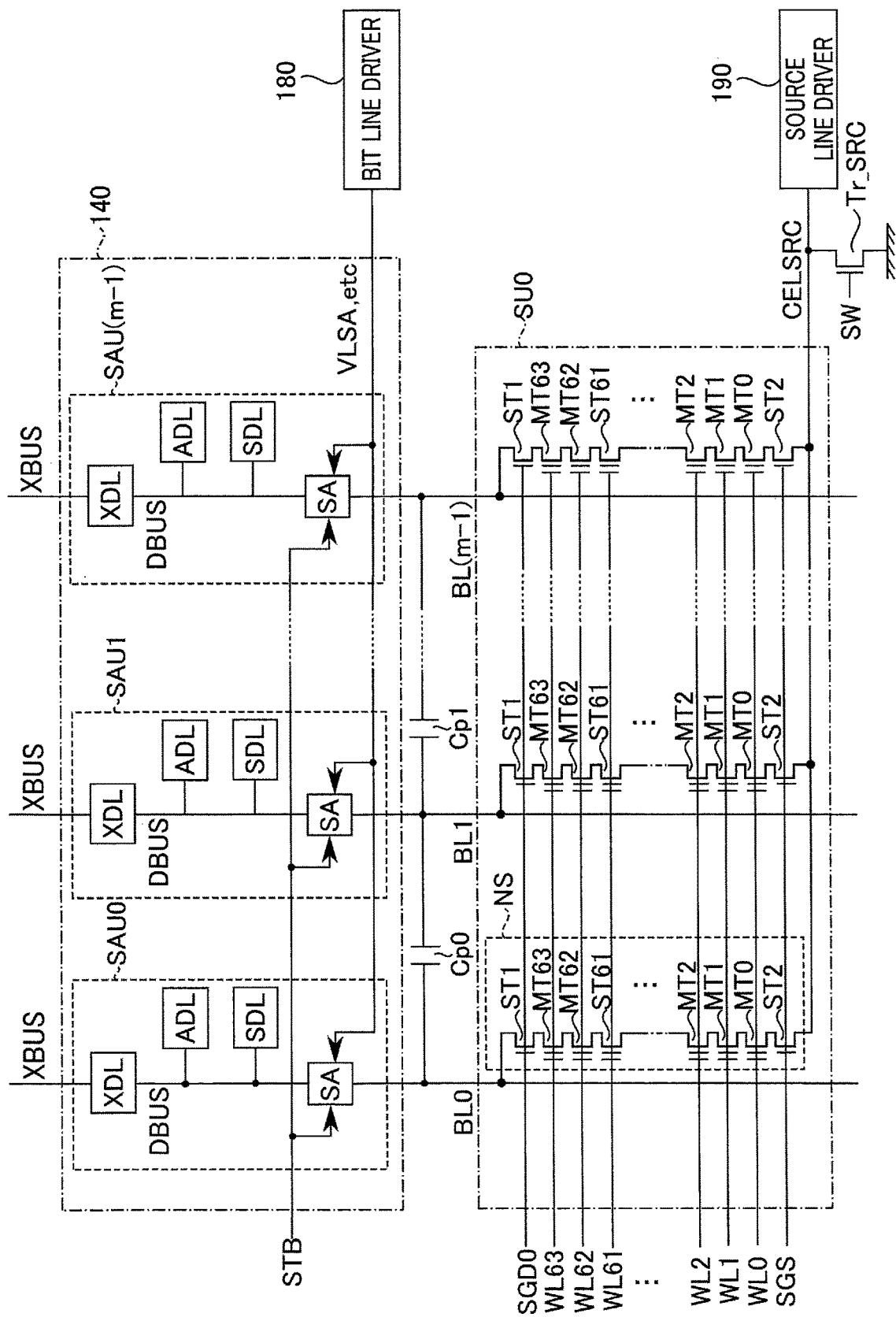
F I G. 5

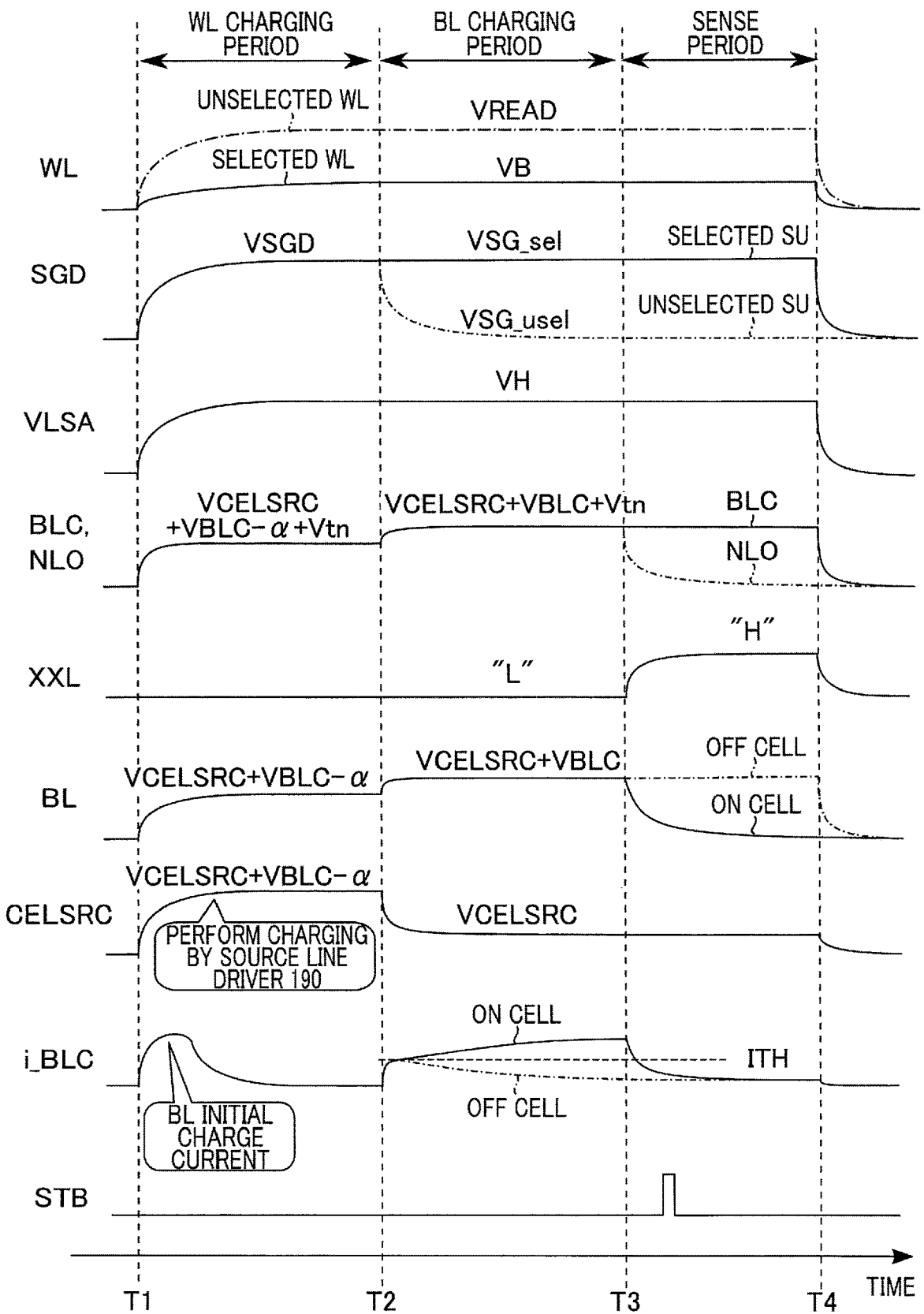
F I G. 9

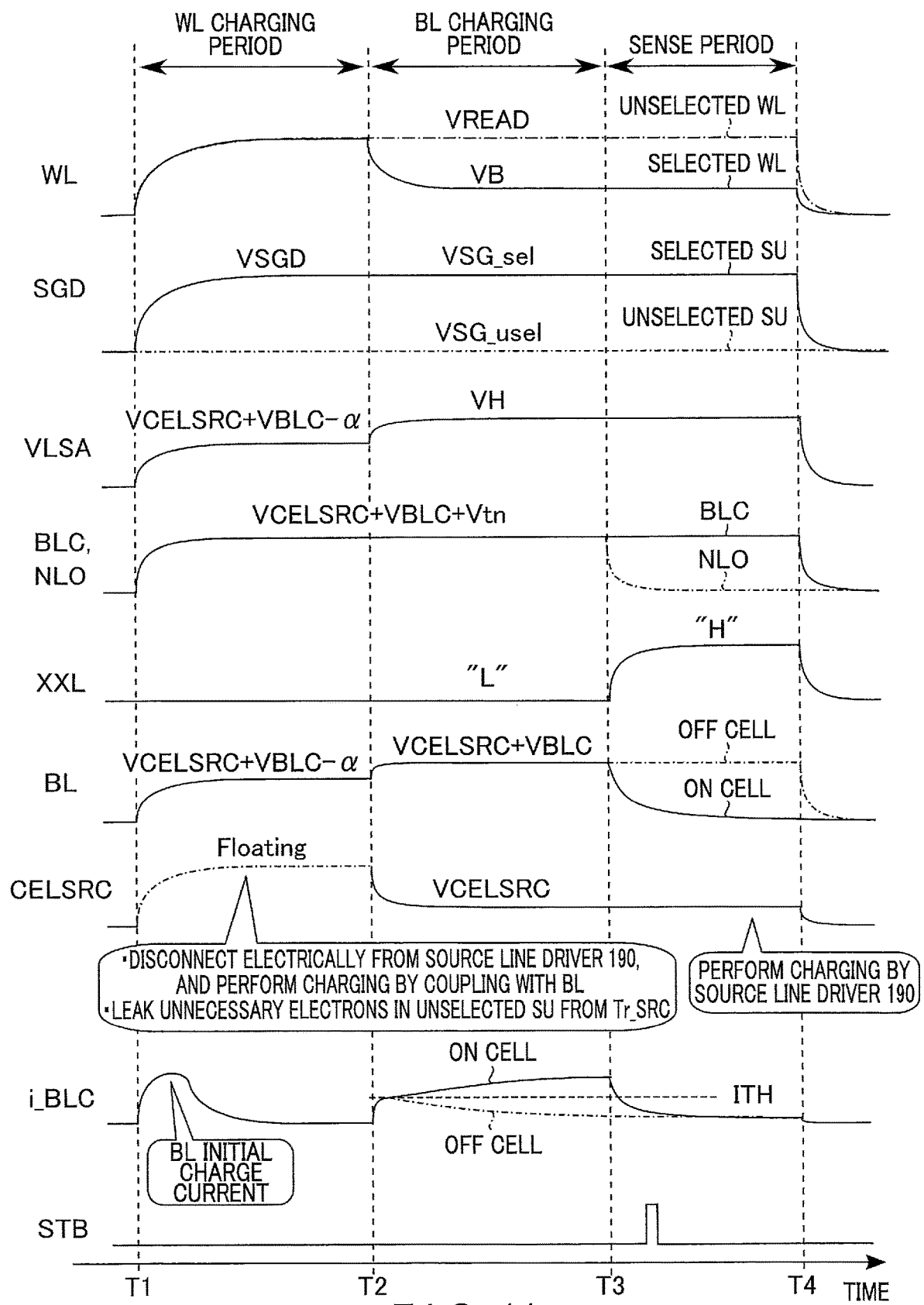
F I G. 11

SEMICONDUCTOR MEMORY DEVICE

CROSS-REFERENCE TO RELATED APPLICATIONS

This application is based upon and claims the benefit of priority from Japanese Patent Application No. 2018-205000, filed Oct. 31, 2018, the entire contents of which are incorporated herein by reference.

FIELD

Embodiments described herein relate generally to a semiconductor memory device.

BACKGROUND

A memory system is known which includes a NAND flash memory serving as a nonvolatile memory and a memory controller controlling the NAND flash memory.

BRIEF DESCRIPTION OF THE DRAWINGS

FIG. 1 is a block diagram to explain a configuration of a memory system that includes a semiconductor memory device according to a first embodiment.

FIG. 2 is a circuit diagram to explain a configuration of a memory cell array of the semiconductor memory device of the first embodiment.

FIG. 5 is a circuit diagram to explain a connection configuration of the memory cell array and a sense amplifier module of the semiconductor memory device of the first embodiment.

FIG. 9 is a timing chart to explain a lower page read operation in a semiconductor memory device according to a second embodiment.

FIG. 11 is a timing chart to explain a lower page read operation in a semiconductor memory device according to a third embodiment.

DETAILED DESCRIPTION

Figure 3:
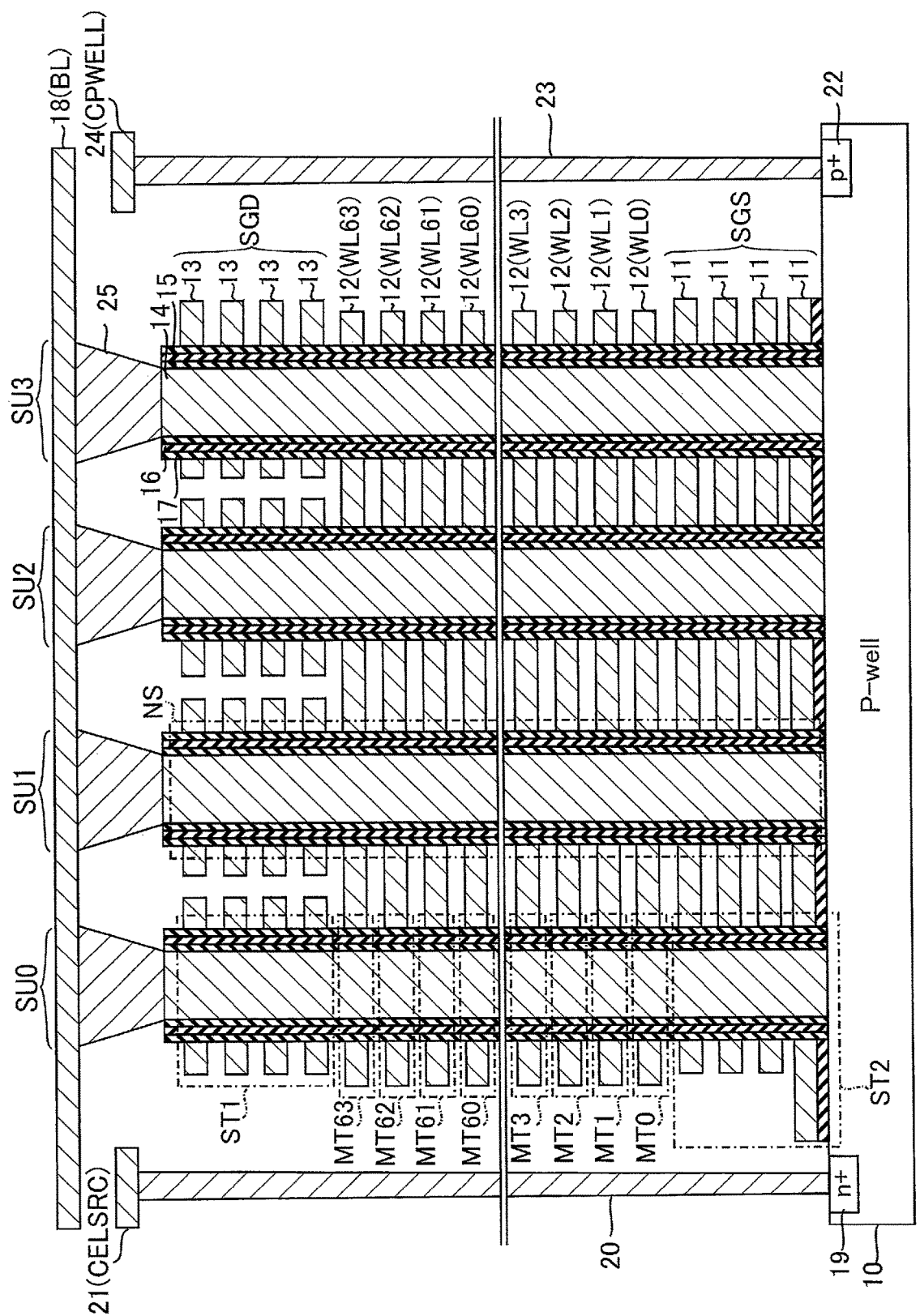
FIG. 3 is a sectional view to explain a configuration of the memory cell array of the semiconductor memory device of the first embodiment.

In general, according to one embodiment, a semiconductor memory device includes a first memory cell transistor, a bit line electrically connected to a first end of the first memory cell transistor; a source line electrically connected to a second end of the first memory cell transistor, and a control circuit. When a read operation for reading data from the first memory cell transistor is performed, the control circuit is configured to apply a first voltage to the bit line in a first period, apply a second voltage, higher than the first voltage, to the bit line in a second period subsequent to the first period, and also apply a third voltage, lower than the first voltage, to the source line in the second period, and sense a threshold voltage of the first memory cell transistor in a third period subsequent to the second period.

Embodiments will be described with reference to the accompanying drawings. In the descriptions below, structural elements having similar functions and configurations will be denoted by common reference symbols. To distinguish a plurality of structural elements having common reference symbols, suffixes will be attached to the common reference symbols. If the structural elements do not have to be distinguished particularly, only the common reference symbols will be used, and no suffixes will be attached.

1. First Embodiment

A semiconductor memory device according to a first embodiment will be described. In the description below, reference will be made to an example in which a memory system comprises a NAND flash memory serving as a semiconductor memory device and a memory controller controlling the NAND flash memory.

1.1 Configuration

The configuration of the memory system according to the first embodiment will be described.

1.1.1 Configuration of Memory System

First, an outline of the configuration including the memory system according to the first embodiment will be described with reference to FIG. 1.

As shown in FIG. 1, a memory system 1 includes a semiconductor memory device (NAND flash memory) 100 and a memory controller 200. The NAND flash memory 100 and the memory controller 200 may constitute one semiconductor device by combining them. Examples of such a semiconductor device are a memory card such as an SD™ card, and a solid state drive (SSD).

The NAND flash memory 100 includes a plurality of memory cells and stores data in a nonvolatile manner. The memory controller 200 is connected to the NAND flash memory 100 through a NAND bus, and is connected to a host device 300 through a host bus. The memory controller 200 controls the NAND flash memory 100 and accesses the NAND flash memory 100 in response to an instruction received from the host device 300. The host device 300 is, for example, a digital camera, a personal computer or the like, and the host bus is, for example, a bus that is compatible with the SD™ interface, a serial attached SCSI (small computer system interface) (SAS), a Serial ATA (advanced technology attachment) (SATA), a PCI (peripheral component interconnect) Express™ (PCIe), or NVM (nonvolatile memory) Express™ (NVMe). The NAND bus is a bus through which signals compatible with the NAND interface are transmitted and received.

As specific examples of a NAND interface signal, there are a chip enable signal CEn, a command latch enable signal CLE, an address latch enable signal ALE, a write enable signal WEn, a read enable signal REn, a ready/busy signal RBn, and an input/output signal DQ.

The signal CEn is a signal for enabling the NAND flash memory 100, and is asserted at a "L (Low)" level. The signals CLE and ALE are signals for notifying the NAND flash memory 100 that input signal DQ to the NAND flash memory 100 are a command and an address, respectively. The signal WEn is a signal that is asserted at the "L" level, and causes the NAND flash memory 100 to receive the input signals DQ. The signal REn is a signal also asserted at the "L" level, and used to read output signal DQ from the NAND flash memory 100. The ready/busy signal RBn is a signal indicative whether the NAND flash memory 100 is in a ready state (i.e., a state where an instruction supplied from the memory controller 200 can be received) or in a busy state (i.e., a state where the instruction supplied from the memory controller 200 cannot be received). The ready/busy signal RBn indicates the busy state when it is at the "L" level. The input/output signal DQ is an 8-bit signal, for example. The input/output signal DQ is an entity of data to be exchanged between the NAND flash memory 100 and the memory controller 200, and includes a command CMD, And an address ADD, and data DAT such as write data and read data and the like.

1.1.2 Configuration of Memory Controller

A detailed configuration of the memory controller 200 will be described with reference to FIG. 1.

The memory controller 200 is, for example, a SoC (System on a chip), and includes a host I/F 210, a memory (RAM) 220, a processor (CPU) 230, a buffer memory 240, a NAND I/F 250, and an ECC circuit 260. Functions of these components 210 to 260 of the memory controller 200 may be realized by either a hardware configuration or a combined configuration of hardware resources and firmware.

The host I/F 210 is connected to the host device 300 via the host bus, and transfers instructions and data received from the host device 300 to the processor 230 and the buffer memory 240. The host I/F 210 also transfers data in the buffer memory 240 to the host device 300 in response to instructions from the processor 230.

The memory 220 is, for example, a semiconductor memory such as a DRAM, and is used as the work space of the processor 230. The memory 220 stores firmware, management tables, etc. used for managing the NAND flash memory 100.

The processor 230 controls the entire operation of the memory controller 200. For example, when a write instruction is received from the host device 300, the processor 230 issues a writing instruction to the NAND I/F 250 in response to the received instruction. Similar operations are performed in read operation and erase operation.

The buffer memory 240 temporarily stores write data or read data.

The NAND I/F 250 is connected to the NAND flash memory 100 via the NAND bus, and performs communications with the NAND flash memory 100. Based on the instruction received from the processor 230, the NAND I/F 250 supplies signals CEn, ALE, CLE, WEn and REn to the NAND flash memory 100. During write operation, the NAND I/F 250 transfers a write command issued by the processor 230 and write data stored in the buffer memory 240 to the NAND flash memory 100 as input/output signals DQ. Furthermore, during read operation, the NAND I/F 250 transfers a read command issued by the processor 230 to the NAND flash memory 100 as input/output signal DQ, receives data read from the NAND flash memory 100 as input/output signal DQ, and transfers the data to the buffer memory 240.

The ECC circuit 260 performs error detection and error correction operation for data stored in the NAND flash memory 100. That is, during write operation, the ECC circuit 260 generates an error correcting code and adds it to the write data. During read operation, the ECC circuit 260 decodes the code to detect the presence or absence of an error bit. If an error bit is detected, a location of the error bit is specified and the error is corrected by the ECC circuit 260.

1.1.3 Configuration of NAND Flash Memory

Next, a description will be given of the configuration of the NAND flash memory 100. As shown in FIG. 1, the NAND flash memory 100 includes a memory cell array 110, a row decoder 120, a driver 130, a sense amplifier module 140, an address register 150, a command register 160, and a sequencer 170.

The memory cell array 110 includes a plurality of blocks BLK each including a plurality of nonvolatile memory cells associated with rows and columns. In FIG. 1, four blocks BLK0 to BLK3 are shown by way of example. The memory cell array 110 stores data provided from the memory controller 200.

The row decoder 120 selects one of the blocks BLK0 to BLK3, based on block address BA stored in the address register 150, and further selects a word line in the selected block BLK.

The driver 130 supplies voltages to the selected block BLK through the row decoder 120, based on a page address PA stored in the address register 150.

During read operation, the sense amplifier module 140 senses the threshold voltage of a memory cell transistor in the memory cell array 110 and reads out data in the memory cell transistor. The sense amplifier module 140 outputs this data. DAT to the memory controller 200. During write operation, the sense amplifier module 140 transfers write data DAT received from the memory controller 200 to the memory cell array 110.

The address register 150 stores address ADD received from the memory controller 200. The address ADD includes the block address BA and page address PA mentioned above. The command register 160 stores command CMD received from the memory controller 200.

The sequencer 170 controls the entire operation of the NAND flash memory 100 based on the command CMD stored in the command register 160.

The configuration of the block BLK will be described with reference to FIG. 2. FIG. 2 is a circuit diagram of one block BLK.

As shown in FIG. 2, block BLK includes, for example, four string units SU (SU0 to SU3). Each string unit SU includes a plurality of NAND strings NS. The number of blocks BLK in the memory cell array 110 is optional, as is the number of string units in one block BLK.

Each of the NAND strings NS includes, for example, 64 memory cell transistors MT (MT0 to MT63) and two select transistors ST1 and ST2. Each of the memory cell transistors MT includes a control gate and a charge accumulation layer, and stores data in a nonvolatile manner. The memory cell transistors MT are connected in series between the source of select transistor ST1 and the drain of select transistor ST2.

The gates of select transistors ST1 of string units SU0 to SU3 are connected to select gate lines SGD0 to SGD3, respectively. On the other hand, the gates of select transistors ST2 of string units SU0 to SU3 are commonly connected to, for example, a select gate line SGS. Alternatively, the gates of select transistors ST2 may be connected to different select gate lines SGS0 to SGS3 (not shown) of the string units. The control gates of the memory cell transistors MT0 to MT63 of the same block BLK are connected to word lines WL0 to WL63, respectively.

The drains of select transistors ST1 of the NAND strings NS of the same column of the memory cell array 110 are commonly connected to a bit line BL (one of BL0 to BL(m−1), where m is a natural number of 2 or more). That is, the bit line BL commonly connects the NAND strings NS of the same column among a plurality of blocks BLK. The sources of select transistors ST2 are commonly connected to a source line CELSRC.

That is, the string unit SU is an aggregation of a plurality of NAND strings NS which are connected to different bit lines BL and are connected to the same select gate line SGD. An aggregation of memory cell transistors MT included in the string unit SU and commonly connected to the same word line WL is also referred to as a cell unit CU (or memory group). The block BLK is an aggregation of a plurality of string units SU that share word lines WL. The memory cell array 110 is an aggregation of a plurality of blocks BLK that share bit lines BL.

FIG. 3 is a sectional view of a partial region of a block BLK. As shown in FIG. 3, a plurality of NAND strings NS are formed on a p type well region 10. To be more specific, four interconnect layers 11 functioning as the select gate lines SGS, 64 interconnect layers 12 functioning as the word lines WL0 to WL63, and, for example, four interconnect layers 13 functioning as the select gate lines SGD are stacked in order above the p type well region 10. Insulating films (not shown) are formed between the stacked interconnect layers.

Pillar-shaped conductors 14 each passing through the interconnect layers 13, 12, and 11 and reaching the p type well region 10 are formed. A Gate insulating film 15, a charge accumulation layer (insulating film or conductive film) 16, and a block insulating film 17 are formed in order on the side surface of the conductor 14. The memory cell transistors MT and the select transistors ST1 and ST2 are formed by these components 14-17. Each conductor 14 is a region which functions as a current path of the NAND string NS and in which the channels of the transistors are formed. A metal interconnect layer 18 functioning as the bit line BL is formed above the conductors 14. Each of the conductors 14 and the metal interconnect layer 18 is connected via a contact plug 25.

An $n^+$ type impurity diffusion layer 19 is formed in a surface region of the p type well region 10. A contact plug 20 is formed on the $n^+$ type impurity diffusion layer 19. The contact plug 20 is connected to a metal interconnect layer 21 functioning as the source line CELSRC. In addition, a $p^+$ type impurity diffusion layer 22 is formed in a surface region of the p type well region 10. A contact plug 23 is formed on the $p^+$ type impurity diffusion layer 22. The contact plug 23 is connected to a metal interconnect layer 24 functioning as a well interconnect CPWELL. The well interconnect CPWELL is an interconnect used to apply a potential to the conductors 14 via the p type well region 10.

A plurality of configurations described above are arranged in the depth direction of the sheet of FIG. 3. Each string unit SU is formed as an aggregation of NAND strings NS arranged in the depth direction.

In this example, one memory cell transistor MT can store, for example, 2-bit data. The bits of the 2-bit data will be referred to as a lower bit and an upper bit. A set of lower bits stored in memory cells belonging to the same cell unit CU will be called a lower page, and a set of upper bits will be called an upper page. That is, two pages are allocated to one word line WL (one cell unit CU) in one string unit SU, and the string unit SU including 64 word lines WL has a capacity of 128 pages. In other words, "page" can be defined as part of the memory space formed in cell unit CU. Data write and data read may be performed in units of page or in units of cell unit CU. Data erasure is performed in units of block BLK.

Figure 4:
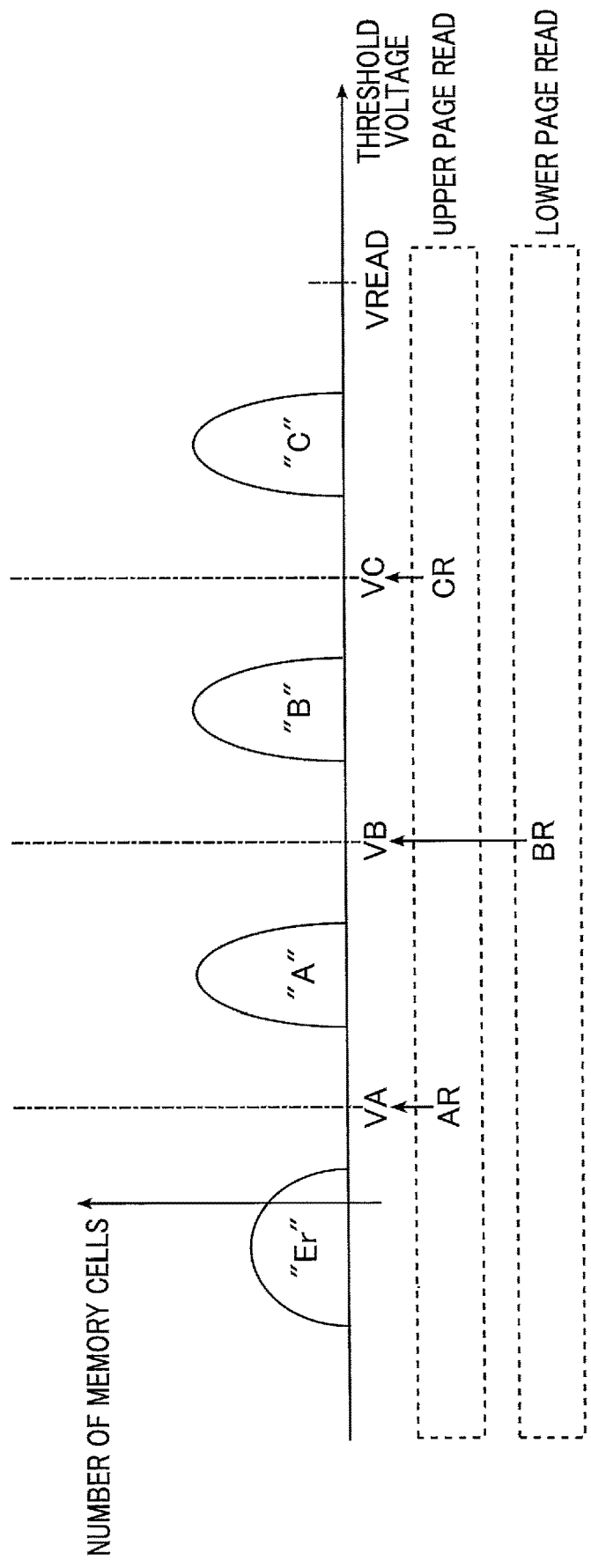
FIG. 4 is a schematic view to explain a threshold voltage distribution of memory cell transistors of the semiconductor memory device of the first embodiment.

FIG. 4 is a diagram illustrating data that can be held in each memory cell transistor MT, a threshold distribution and voltages that are used at the time of read operation.

As described above, the memory cell transistor MT can store 2-bit data. That is, four states are available in accordance with the threshold voltage in each memory cell transistor MT. These four states are referred to as "Er" state, "A" state, "B" state and "C" state in the ascending order of the threshold voltage.

The threshold voltage of the memory cell transistor MT in the "Er" state is lower than a voltage VA, and corresponds to the data erased state. The threshold voltage of the memory cell transistor MT in the "A" state is equal to or higher than the voltage VA and is lower than a voltage VB (>VA). The threshold voltage of the memory cell transistor MT in the "B" state is equal to or higher than the voltage VB and is lower than a voltage VC (>VB). The threshold voltage of the memory cell transistor MT in the "C" state is equal to or higher than the voltage VC and is lower than a voltage VREAD. Of the four states distributed in this manner, the "C" state is a state in which the threshold voltage is highest. Voltages VA to VC are also collectively referred to as voltage VCGR. The voltage VREAD is, for example, a voltage applied to the word lines WL that is not a read target in the read operation, and is a voltage that turns on the memory cell transistor MT regardless of the data stored therein.

The threshold voltage distribution described above is realized by writing 2-bit (2-page) data consisting of the aforementioned lower bit and higher bit. That is, the transition from the "Er" state to the "C" state is related to the lower bit and upper bit, as follows:

"Er" state: "11" (in the order of "upper bit" and "lower bit")
"A" state: "01"
"B" state: "00"
"C" state: "10"

As can be seen from this, only one of the two bits changes between the data corresponding to the two states adjacent in the threshold voltage distribution.

Therefore, when a lower bit is read, a voltage corresponding to the boundary at which the value ("0" or "1") of the lower bit changes may be used, and the same applies to the upper bit.

That is, as shown in FIG. 4, when the lower page is read, the voltage VB that distinguishes between the "A" state and the "B" state is used as the read level. The read operation using the voltage VB is called a read operation BR.

In the read operation BR, it is determined whether or not the threshold voltage for the memory cell transistor MT is lower than the voltage VB.

In the reading of the upper page, the voltage VA that distinguishes between the "Er" state and the "A" state, and the voltage VC that distinguishes between the "B" state and the "C" state are used as read levels. Read operations using voltages VA and VC will be referred to as read operations AR and CR, respectively.

In the read operation AR, it is determined whether or not the threshold voltage for the memory cell transistor MT is lower than voltage VA. That is, the memory cell transistor MT in the erased state is specified by the read operation AR. In the read operation CR, it is determined whether or not the threshold voltage for the memory cell transistor MT is lower than the voltage VC.

1.1.4 Connection Configuration between Memory Cell Array and Sense Amplifier Module Next, a connection configuration between the memory cell array and the sense amplifier module in the semiconductor memory device is described according to the first embodiment, using the example of the circuit diagram shown in FIG. 5. In the example shown in FIG. 5, the connection configuration between string unit SU0 of a certain block BLK of the memory cell array 110 and sense amplifier module 140 is shown for convenience of description. As shown in FIG. 5, the sense amplifier module 140 includes sense amplifier units SAU (SAU0, SAU1, SAU (m−1)) provided for respective bit lines BL.

Each bit line BL has parasitic capacitance Cp (Cp0, Cp1, . . . ) between the NAND string NS and the sense amplifier unit SAU. Although only the parasitic capacitance Cp(k) between bit line BLk and bit line BL(k+1) is illustrated in the example of FIG. 5, the parasitic capacitance Cp is not limited to this but exists between combinations of any bit lines BL (0≤k≤m−1).

Each sense amplifier unit SAU includes a sense amplifier SA and a plurality of (e.g., three) latch circuits ADL, SDL, and XDL. Although the example shown in FIG. 5 illustrates the case where three latch circuits are connected, this is not restrictive. The sense amplifier unit SAU may include an optional number of latch circuits.

The sense amplifier SA applies a voltage to the bit line BL, for example, during read operation. Then, the sense amplifier SA senses the threshold voltage of the selected memory cell transistor, using the voltage or current of the corresponding bit line BL, and reads data from the selected memory cell transistor. That is, the sense amplifier SA is a module that directly controls the bit line BL.

During read operation, strobe signal STB is supplied to the sense amplifier SA, for example, from the sequencer 170. The sense amplifier SA determines read data at the timing when the strobe signal STB is asserted, and causes latch circuit SDL to store the read data. Latch circuit ADL is configured to temporarily store read data and write data independently of latch circuit SDL. For example, by temporarily developing data of latch circuits SDL and XDL in latch circuit ADL, various logical operations can be performed with respect to the data, including a NOT operation, an OR operation, an AND operation a NAND operation, a NOR operation, and an XOR operation.

The sense amplifier SA and latch circuits ADL and SDL are connected to a common node (bus DBUS) such that data can be transmitted and received. Latch circuit XDL is connected via the bus DBUS to the sense amplifier SA and latch circuits SDL and ADL.

The input/output of data to or from the sense amplifier module 140 is performed via the latch circuit XDL. That is, data received from the memory controller 200 is transferred to latch circuits ADL and SDL or to the sense amplifier SA, via latch circuit XDL. Further, data of latch circuits ADL and SDL or data of the sense amplifier SA is transmitted to the memory controller 200 as any one of signals DQ<7:0>, via bus XBUS connected to latch circuit XDL. Latch circuit XDL functions as a cache memory for the NAND flash memory 100. Therefore, even when data are stored in latch circuits. ADL and SDL, the NAND flash memory 100 can be set in the ready state as long as data is not stored in latch circuit XDL.

A bit line driver 180 and a source line driver 190, which are capable of supplying voltages independently each other, are connected to the bit line BL and the source line CELSRC, respectively. That is, the sense amplifier SA can apply the voltage supplied from the bit line driver 180 to the bit line BL via node VLSA or the like.

On the other hand, the source line driver 190 is configured to apply a voltage to the source line CLESRC independently of the voltage applied to the bit line BL. The source line CELSRC is connected, for example, to a first end of a transistor Tr_SRC. A second end of the transistor Tr_SRC is grounded, and a discharge path of the source line CELSRC is secured thereby. The transistor Tr_SRC can control whether the potential of the source line CELSRC should be discharged to the ground potential or maintain the potential of source line CELSRC in accordance with a signal SW supplied to a gate of the Transistor Tr_SRC. The transistor Tr_SRC may be configured such that when it is weakly on, it leaks (discharges) unnecessary electrons in the string unit SU to the ground while simultaneously maintaining the potential of the source line CELSRC.

Figure 6:
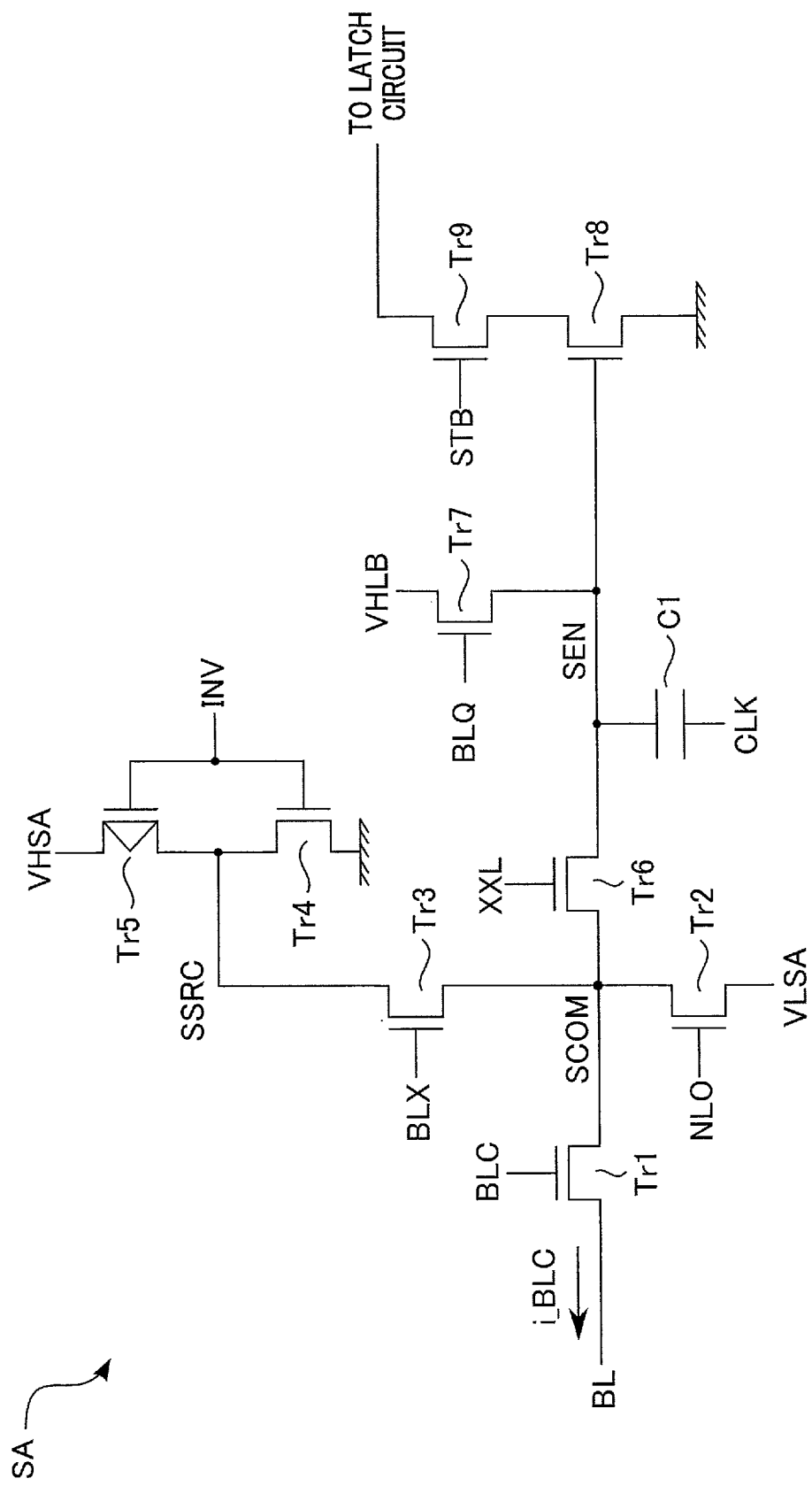
FIG. 6 is a circuit diagram to explain a configuration of a sense amplifier of the semiconductor memory device of the first embodiment.

FIG. 6 is a circuit diagram to explain a configuration of a sense amplifier of the semiconductor memory device of the first embodiment. As shown in FIG. 6, the sense amplifier SA includes transistors Tr1, Tr2, Tr3, Tr4, Tr5, Tr6, Tr7, Tr8 and Tr9, and a capacitor C1. Each of the transistors Tr1 to Tr4 and Tr6 to Tr9 is, for example, an n-type transistor, and the transistor Tr5 is, for example, a p-type transistor.

The transistor Tr1 includes a first end connected to a bit line BL, a second end connected to a node SCOM, and a gate connected to a node BLC. The transistor Tr1 has, for example, a threshold voltage Vtn. When a voltage higher than a voltage (X+Vtn) is supplied to the second end and the voltage (X+Vtn) is supplied to the node BLC, the transistor Tr1 is configured to clamp the voltage supplied to the first end to a voltage X (X is an real number). In the description below, the current flowing from the sense amplifier SA to the bit line BL via the transistor Tr1 will be referred to as current i_BLC.

The transistor Tr2 includes a first end connected to node the SCOM, a second end connected to a node VLSA, and a gate connected to a node NLO. The transistor Tr3 includes a first end connected to the node SCOM, a second end connected to a node SSRC, and a gate connected to a node BLX.

The transistor Tr4 includes a first end connected to node the SSRC, a second end that is grounded, and a gate connected to a node INV. The transistor Tr5 includes a first end connected to the node SSRC, a second end connected to node a VHSA, and a gate connected to node the INV.

The transistor Tr6 includes a first end connected to node the SCOM, a second end connected to a node SEN, and a gate connected to a node XXL. The capacitor C1 includes a first end connected to the node SEN and a second end connected to a node CLK.

The transistor Tr7 includes a first end connected to node the SEN, a second end connected to a node VHLB, and a gate connected to node a BLQ.

The transistor Tr8 includes a first end that is grounded, a second end connected to the first end of the transistor Tr9, and a gate connected to the node SEN. The transistor Tr9 includes a second end connected to a latch circuit (for example, latch circuit SDL), and a gate to which the strobe signal STB is supplied.

With the above configuration, the sense amplifier SA can sense the threshold voltage of the memory cell transistor MT based on the potential of the node SEN, and can read data to the latch circuit SDL.

1.2 Read Operation

Next, a read operation in the semiconductor memory device of the first embodiment will be described.

1.2.1 Lower Page Read Operation

Figure 7:
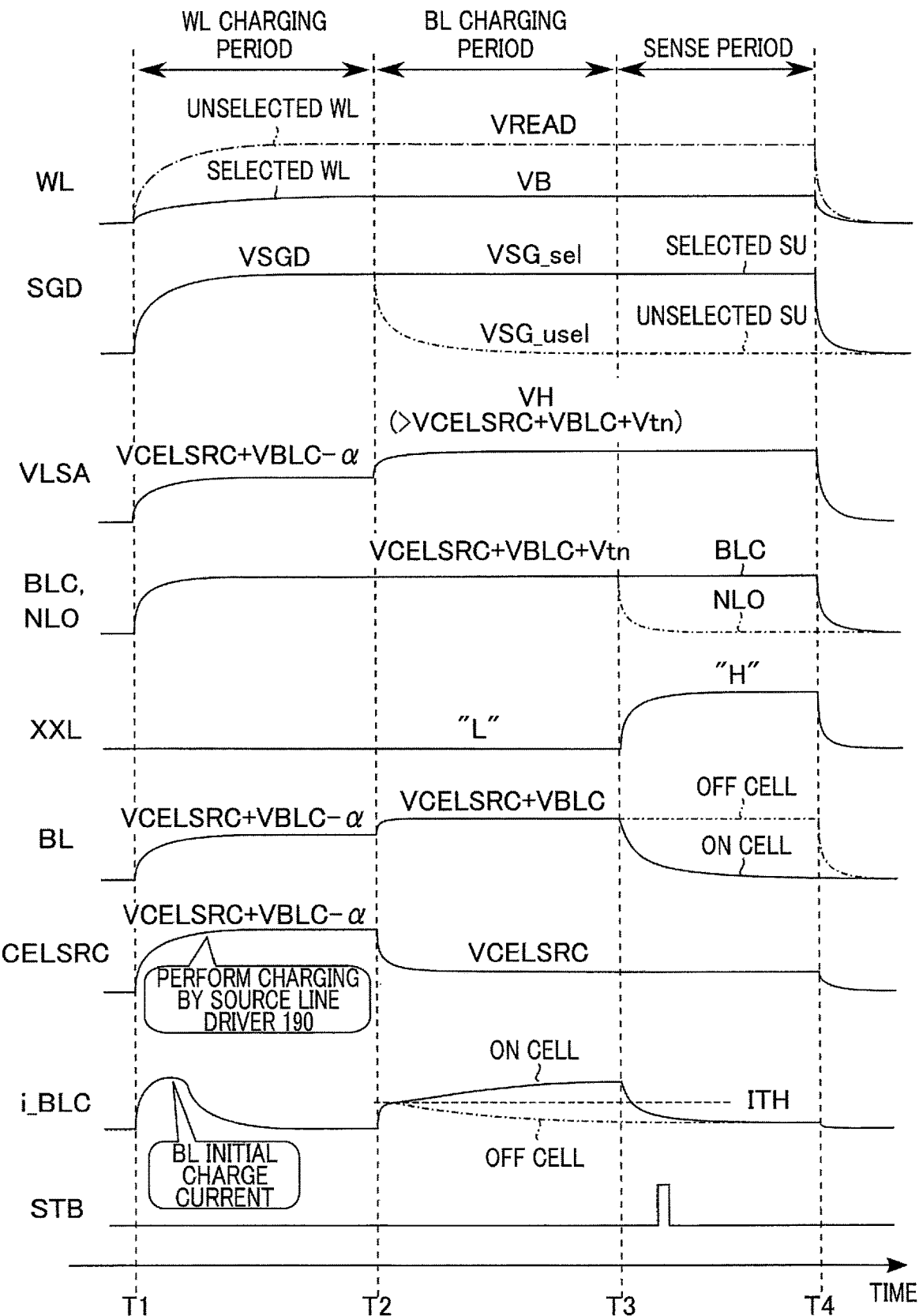
FIG. 7 is a timing chart to explain a lower page read operation in the semiconductor memory device of the first embodiment.

First, the lower page read operation will be described with reference to FIG. 7. FIG. 7 is an example of a timing chart to explain a lower page read operation in the semiconductor memory device of the first embodiment.

As shown in FIG. 7, the read operation includes, for example, three periods. More specifically, the read operation includes a WL charging period for charging the voltage of the word lines WL to predetermined magnitudes, a BL charging period for charging the voltage of the bit line BL to a predetermined magnitude, and a sense period for sensing the threshold voltage of the memory cell transistor MT based on the charged word lines WL and bit line BL. In the example shown in FIG. 7, the WL charging period, the BL charging period and the sense period respectively correspond to the period from time T1 to time T2, the period from time T2 to time T3, and the period from time T3 to time T4.

In the description below, "selected" is attached to memory cell transistor MT that is targeted to be read and components corresponding to the memory cell transistor MT that is targeted to be read. On the other hand, "unselected" is attached to the memory cell transistors MT that is not targeted to be read and the components corresponding to the memory cell transistors MT that is not targeted to be read, such that these components are distinguished from the "selected" components.

First, an operation in the WL charging period will be described. According to the first embodiment, in the WL charging period, the bit line BL is charged to a predetermined voltage in advance. In the description below, the in-advance charging of the bit line BL in the WL charging period will also be referred to as "initial charging of the bit line BL" or "BL initial charging".

At time T1, the row decoder 120 applies the read voltage VB to selected word line WL, and applies the voltage VREAD to unselected word lines WL. Also, the row decoder 120 applies a voltage VSGD to all select gate lines SGD. The voltage VSGD is, for example, a voltage high enough to turn on the select transistors ST1. Although not shown in FIG. 7, the row decoder 120 applies selected gate line SGS with a voltage VSGS high enough to turn on the select transistors ST2.

As a result, all the memory cell transistors MT connected to the unselected word line WL are turned on. The memory cell transistors MT connected to the selected word line WL are in the on state when the threshold voltage is lower than voltage VB (on cell), and are in the off state when the threshold voltage is equal to or higher than voltage VB (off cell). Because the select transistors ST1 and ST2 are turned on, unnecessary electrons in the unselected string units SU are discharged through the bit line BL or through the source line CELSRC.

In the WL charging period, initial charging of bit line BL is performed in parallel. Specifically, the bit line driver 180 applies a voltage (VCELSRC+VBLC−α) to the node VLSA.

A voltage VCELSRC is a voltage that is to be applied to the source line CELSRC in the sense period described later. A voltage (VCELSRC+VBLC) is a voltage that is to be applied to the bit line BL in the sense period. That is, a voltage VBLC corresponds to a potential difference between the voltages that are applied to the bit line BL and source line CELSRC in the sense period.

The voltage (VCELSRC+VBLC−α) is higher than the voltage VCELSRC and lower than the voltage (VCELSRC+VBLC) (VCELSRC<(VCELSRC+VBLC−α)< (VCELSRC+VBLC)). A voltage α is a variable that is based on the load characteristics of the bit line BL and that corresponds to a threshold current ITH to flow to the bit line BL when the potential difference of the bit line BL with respect to the source line CELSRC becomes (VBLC−α). The threshold current ITH is set as a threshold which the sense amplifier SA uses to determine whether the selected memory cell transistor MT is an on cell or an off cell in the sense period. That is, the sense amplifier SA can determine that the selected memory cell transistor MT is an on cell where a current larger than the threshold current ITH flows through the bit line BL, and can determine that the selected memory cell transistor is an off cell where a current smaller than the threshold current ITH flows.

The sense amplifier SA supplies a voltage (VCELSRC+VBLC+Vtn) to the nodes BLC and NLO to turn on the transistors Tr1 and Tr2, and supplies an "L" level voltage to the node XXL to turn off the transistor Tr6. Thereby, the bit line BL is charged by the voltage (VCELSRC+VBLC−α) of the node VLSA through the transistor Tr2.

On the other hand, the source line driver 190 applies the voltage (VCELSRC+VBLC−α) to the source line CELSRC. Thus, the source line CELSRC is charged to the same voltage as the bit line BL, independently of the bit line BL.

In this manner, in the WL charging period, the bit line BL and the source line CELSRC are charged to voltages equal to each other, and therefore, almost no current flows between the bit line BL and the source line CELSRC. As described above, however, the parasitic capacitance Cp is present between the plurality of bit lines BL. Therefore, as each bit line BL is charged to voltage (VCELSRC+VBLC−α), a BL initial charge current flows into that bit line BL, so that the parasitic capacitance Cp becomes "0" with respect to the voltage (VCELSRC+VBLC−α). The BL initial charge current stops flowing when the charging of the parasitic capacitance Cp is completed.

Next, an operation in the BL charging period will be described.

At time T2, the row decoder 120 applies a voltage VSG_sel to the select gate line SGD corresponding to the selected string unit SU, and applies a voltage VSG_usel to the select gate lines SGD corresponding to the unselected string units SU. The voltages VSG_sel and VSG_usel are respectively a voltage that turns on the select transistor ST1 and a voltage that turns off the select transistor ST1, and are voltages that are to be applied to select gate lines SGD in the sense period. As a result, the unselected string units SU are turned to off-state, and the selected string unit SU is turned to on-state when the selected memory cell transistor MT is an on cell (when the threshold voltage is lower than voltage VB), and is turned to off-state when it is an off cell (when the threshold voltage is equal to or higher than VB).

The bit line driver 180 applies a voltage VH to the node VLSA. The voltage VH is higher than the voltage (VCELSRC+VBLC+Vtn) (VH>(VCELSRC+VBLC+Vtn)). Thereby, the voltage VH of the node VLSA is clamped to the voltage (VCELSRC+VBLC) by the transistor Tr1 and is supplied to the bit line BL, and the bit line BL is charged to the voltage (VCELSRC+VBLC).

On the other hand, the source line driver 190 applies the voltage VCELSRC to the source line CELSRC. As a result, the potential difference between the source line CELSRC and the bit line BL becomes VBLC.

As described above, the bit line BL has a load characteristic in which current i_BLC attains threshold current ITH based on the potential difference (VBLC−α) between the bit line BL and the source line CELSRC, and is charged such that it has potential difference (VBLC−α) with respect to the source line CELSRC during the WL charging period. Therefore, when the potential difference between the bit line BL and the source line CELSRC becomes VBLC at time T2, current i_BLC flowing through the bit line BL rapidly reaches the threshold current ITH without being affected by the parasitic capacitance Cp, and then the operation transitions to an operating point adapted to the state of the selected memory cell transistor MT. That is, when the selected memory cell transistor MT is an on cell, current i_BLC becomes larger than the threshold current ITH, and when it is an off cell, current i_BLC becomes smaller than the threshold current ITH.

Next, an operation in the sense period will be described.

At time T3, the sense amplifier SA applies an "L" level voltage to the node NLO to turn off the transistor Tr2, and applies an "H" level voltage to the node XXL to turn on the transistor Tr6. As a result, the bit line BL is electrically disconnected from the bit line driver 180 and is connected to the node SEN.

Where the selected memory cell transistor MT is an off cell, current i_BLC does not flow from the bit line BL toward the source line CELSRC, so that the potentials of the bit line BL and the node SEN hardly drop from the voltage (VCELSRC+VBLC). As a result, the node SEN maintains the "H" level, and the transistor Tr8 is turned on. Therefore, when the transistor Tr9 is turned on in response to the strobe signal STB, the node connected to the latch circuit SDL is grounded (becomes "L" level).

On the other hand, where the selected memory cell transistor MT is an on cell, current i_BLC flows from the bit line BL to the source line CELSRC through the selected memory cell transistor MT, so that the potentials of the bit line BL and the node SEN decrease toward VCELSRC of the source line CELSRC, and the transistor Tr8 is turned off. Therefore, even when the transistor Tr9 is turned on in response to the strobe signal STB, the node connected to the latch circuit SDL is not grounded (becomes "H" level).

By the operation described above, data is read and stored in the latch circuit in accordance with whether or not the threshold voltage of the selected memory cell transistor MT is equal to or higher than voltage VB in the sense period.

Thus, the lower page read operation finishes.

1.2.2 Upper Page Read Operation

Figure 8:
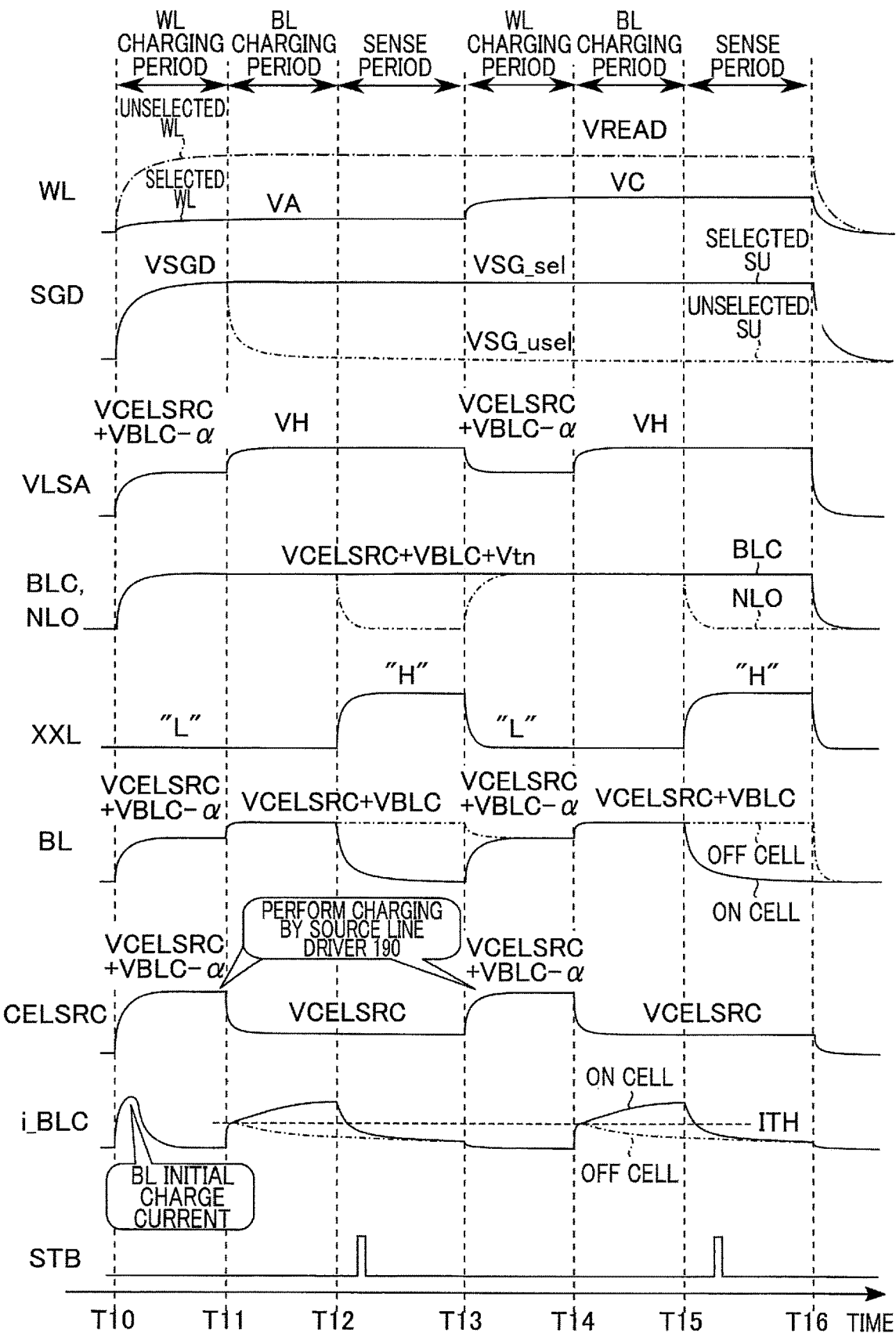
FIG. 8 is a timing chart to explain an upper page read operation in the semiconductor memory device of the first embodiment.

Next, the upper page read operation will be described with reference to FIG. 8. FIG. 8 is an example of a timing chart to explain an upper page read operation in the semiconductor memory device of the first embodiment.

As shown in FIG. 8, the upper page read operation includes, for example, a read operation AR and a read operation CR each including a WL charging period, a BL charging period and a sense period. In the example shown in FIG. 8, the WL charging period, BL charging period and sense period in the read operation AR respectively correspond to the period from time T10 to time T11, the period from time T11 to time T12, and the period from time T12 to time T13. The WL charging period, BL charging period and sense period in the read operation CR respectively correspond to the period from time T13 to time T14, the period from time T14 to time T15, and the period from time T15 to time T16.

First, in the period from time T10 to T13, the read operation AR is performed. The read operation AR is similar to the lower page read operation (that is, the read operation BR) described with reference to T1 to T4 in FIG. 7, except that the voltage VA is applied to selected word line WL. Therefore, details of the operation performed in the period from T10 to T13 will be omitted.

When the sense period of the read operation AR finishes, the WL charging period of the read operation CR subsequently starts.

At time T13, the row decoder 120 applies the read voltage VC to the selected word line WL. As a result, the memory cell transistors MT connected to the selected word line WL are in the on state when the threshold voltage is lower than voltage VC (on cell), and are in the off state when the threshold voltage is equal to or higher than voltage VC (off cell).

In addition, the bit line driver 180 applies the voltage (VCELSRC+VBLC−α) to the node VLSA. The sense amplifier SA supplies the voltage (VCELSRC+VBLC+Vtn) to node the NLO to turn on the transistors Tr2, and supplies an "L" level voltage to the node XXL to turn off the transistor Tr6. As a result, the bit line BL is electrically disconnected from the node SEN and is connected to the node VLSA. Thereby, the bit line BL is charged again by the voltage (VCELSRC+VBLC−α) of the node VLSA through the transistor Tr2.

On the other hand, the source line driver 190 applies the voltage (VCELSRC+VBLC−α) to the source line CELSRC. Thus, the source line CELSRC is charged again to the same voltage as the bit line BL, independently of the bit line BL.

In this manner, in the WL charging period of read operation CR, the bit line BL and the source line CELSRC are charged to voltages equal to each other, and therefore, almost no current flows between the bit line BL and the source line CELSRC, as in the WL charging period of read operation AR. As the bit line EL is charged to the voltage (VCELSRC+VBLC−α), the parasitic capacitance Cp becomes "0" with respect to the voltage (VCELSRC+VBLC−α). Since the bit line BL is charged to the voltage (VCELSRC+VBLC) in the read operation AR, the BL initial charge current in the WL charging period of the read operation CR is smaller than the BL initial charge current in the WL charging period of the read operation AR.

By the operation described above, the WL charging period of the read operation CR finishes.

The BL charging period and the sense period of the read operation CR are similar to those of the read operation BR described with reference to T2 to T4 in FIG. 7 and to those of the read operation AR described with reference to T1 to T13 in FIG. 8, except that the voltage VC is applied to selected word line WL. Therefore, details of the operation performed in the period from T14 to T16 will be omitted.

Thus, the upper page read operation finishes.

1.3 Advantages of Present Embodiment

According to the first embodiment, in the WL charging period, the bit line driver 180 applies the voltage (VCELSRC+VBLC−α) to the node VLSA, and this voltage (VCELSRC+VBLC−α) is supplied to the bit line BL via the transistor Tr1. The source line driver 190 applies the voltage (VCELSRC+VBLC−α) to the source line CELSRC. In the BL charging period, the bit line driver 180 applies the voltage VH to the node VLSA. The transistor Tr1 clamps the voltage VH to the voltage (VCELSRC+VBLC) and supplies it to the bit line BL. The source line driver 190 applies the voltage VCELSRC to the source line CELSRC. Thereby, the parasitic capacitance Cp of the bit line BL can be adjusted to the load level of the threshold current ITH during the WL charging period. Owing to this, in the BL charging period, current i_BLC flowing to the bit line BL can be quickly raised to the threshold current ITH. In the BL charging period, therefore, it can be quickly determined whether current i_BLC is larger or smaller than the threshold current ITH, and hence, the time required for the read operation can be shortened.

To supplement the description, if the bit line EL is not sufficiently charged during the BL charging period, current i_BLC starts from a state smaller than the threshold current ITH. Then, current i_BLC eventually becomes larger than the threshold current ITH when the selected memory cell transistor MT is an on cell, and becomes smaller than the threshold current ITH when the selected memory cell transistor MT is an off cell. Therefore, when the selected memory cell transistor MT is an on cell, a long time is required before it can be determined that the current i_BLC is larger than the threshold current ITH, and the time required for the read operation may be long.

If the bit line BL is excessively charged during the BL charging period, current i_BLC starts from a state larger than the threshold current ITH. Then, current i_BLC eventually becomes larger than the threshold current ITH when the selected memory cell transistor MT is an on cell, and becomes smaller than the threshold current ITH when the selected memory cell transistor MT is an off cell. Therefore, when the selected memory cell transistor MT is an off cell, a long time is required before it can be determined that the current i_BLC is smaller than the threshold current ITH, and the time required for the read operation may be long.

In contrast to the above, according to the first embodiment, current i_BLC charges the bit line BL to the voltage (VCELSRC+VBLC−α) in advance during the WL charging period. Thus, during the BL charging period, current i_BLC starts from the threshold current ITH. Therefore, regardless of whether the selected memory cell transistor MT is an on cell or an off cell, it can be quickly determined whether current i_BLC is larger or smaller than the threshold current ITH.

Further, in a case where data is read by a plurality of read operations AR and CR, as in the upper page read operation, the bit line BL is charged in advance to the voltage (VCELSRC+VBLC−α) even during the WL charging period of read operation CR. Owing to this, the BL charging period of the read operation CR can be similarly shortened, and the time required for the read operation can be further shortened.

The sense amplifier SA applies the voltage (VCELSRC+VBLC+Vtn) to the nodes BLC and NLO. As a result, in a case where the voltage of the node VLSA is lower than the voltage (VCELSRC+VBLC), the transistor Tr1 can transfer the voltage of the node VLSA to the bit line BL without clamping the voltage. Therefore, the bit line BL can be charged to the voltage (VCELSRC+VBLC−α) applied to the node VLSA by the bit line driver 180, independent of the threshold voltage Vtn of the transistor Tr1.

2. Second Embodiment

Next, a semiconductor memory device according to a second embodiment will be described. The second embodiment differs from the first embodiment in that the voltage of the bit line BL charged in the WL charging period has a dependency on the threshold voltage Vtn of the transistor Tr1. In the description below, configurations and operations similar to those of the first embodiment will be omitted, and mainly configurations and operations different from those of the first embodiment will be described.

2.1 Lower Page Read Operation

First, a lower page read operation will be described with reference to FIG. 9. FIG. 9 is an example of a timing chart to explain a lower page read operation in a semiconductor memory device of the second embodiment. FIG. 9 corresponds to FIG. 7 referred to in connection with the first embodiment.

As shown in FIG. 9, at time T1, the row decoder 120 applies the read voltage VB to selected word line WL, and applies the voltage VREAD to unselected word lines WL. Also, the row decoder 120 applies the voltage VSGD to all select gate lines SGD. Although not shown in FIG. 9, the row decoder 120 applies select gate line SGS with the voltage VSGS high enough to turn on the select transistors ST2.

As a result, all the memory cell transistors MT connected to the unselected word line WL are turned on. The memory cell transistors MT connected to the selected word line WL are in the on state when the threshold voltage is lower than voltage NIB (on cell), and are in the off state when the voltage is equal to or higher than voltage VB (off cell). When the select transistors ST1 and ST2 are turned on, unnecessary electrons in string units SU are discharged through the bit line BL or through the source line CELSRC.

In the WL charging period, initial charging of bit line BL is performed in parallel. Specifically, the bit line driver 180 applies the voltage VH to the node VLSA.

The sense amplifier SA supplies the voltage (VCELSRC+VBLC−α+Vtn) to the nodes BLC and NLO to turn on the transistors Tr1 and Tr2, and supplies an "L" level voltage to the node XXL to turn off the transistor Tr6. Thereby, the voltage transferred from node VLSA via Tr2 and Tr1 is clamped to the voltage (VCELSRC+VBLC−α), and the bit line BL is charged to the voltage (VCELSRC+VBLC−α).

On the other hand, the source line driver 190 applies the voltage (VCELSRC+VELC−α) to the source line CELSRC. Thus, the source line CELSRC is charged to the same voltage as the bit line BL, independently of the bit line BL.

In this manner, in the WL charging period, the bit line BL and the source line CELSRC are charged to voltages equal to each other, and therefore, almost no current flows between the bit line BL and the source line CELSRC. As described above, however, the parasitic capacitance Cp is present between a plurality of bit lines EL. Therefore, as the bit line BL is charged to the voltage (VCELSRC+VELC−α), a BL initial charge current flows into the bit line BL, so that the parasitic capacitance Cp becomes "0" with respect to the voltage (VCELSRC+VBLC−α). The BL initial charge current stops flowing when the charging of the parasitic capacitance Cp is completed.

Next, an operation in the BL charging period will be described.

At time T2, the row decoder 120 supplies the voltage VSG_sel to the select gate line SGD of the selected string unit SU, and supplies the voltage VSG_usel to the select gate lines SGD of the unselected string units SU. As a result, the unselected string units SU are turned to off-state, and the selected string unit SU is turned to on-state when the selected memory cell transistor MT is an on cell (when the threshold voltage is lower than voltage VB), and is turned to off-state when it is an off cell (when the threshold voltage is equal to or higher than VB).

The sense amplifier SA applies the voltage (VCELSRC+VBLC+Vtn) to the nodes BLC and NLO. Thereby, the voltage transferred from node VLSA via Tr2 and Tr1 is clamped to the voltage (VCELSRC+VBLC), and the bit line BL is charged to the voltage (VCELSRC+VBLC).

On the other hand, the source line driver 190 applies the voltage VCELSRC to the source line CELSRC. As a result, the potential difference between the source line CELSRC and the bit line BL becomes VBLC.

As described above, the bit line BL has a load characteristic in which current i_BLC attains threshold current ITH based on the potential difference (VBLC−α) between the bit line BL and the source line CELSRC, and is charged such that it has potential difference (VBLC−α) with respect to the source line CELSRC during the WL charging period. Therefore, when the potential difference between the bit line BL and the source line CELSRC becomes VBLC at time T2, current i_BLC flowing through the bit line BL rapidly reaches the threshold current ITH without being affected by the parasitic capacitance Cp, and then the operation transitions to an operating point adapted to the state of the memory cell transistor MT. That is, when the selected memory cell transistor MT is an on cell, current i_BLC becomes larger than the threshold current ITH, and when it is an off cell, current i_BLC becomes smaller than the threshold current ITH.

An operation in the sense period is similar to the operation from time T3 to T4 of FIG. 7 referred to in connection with the first embodiment, and thus a description thereof will be omitted.

In this manner, the lower page read operation finishes.

2.2 Upper Page Read Operation

Figure 10:
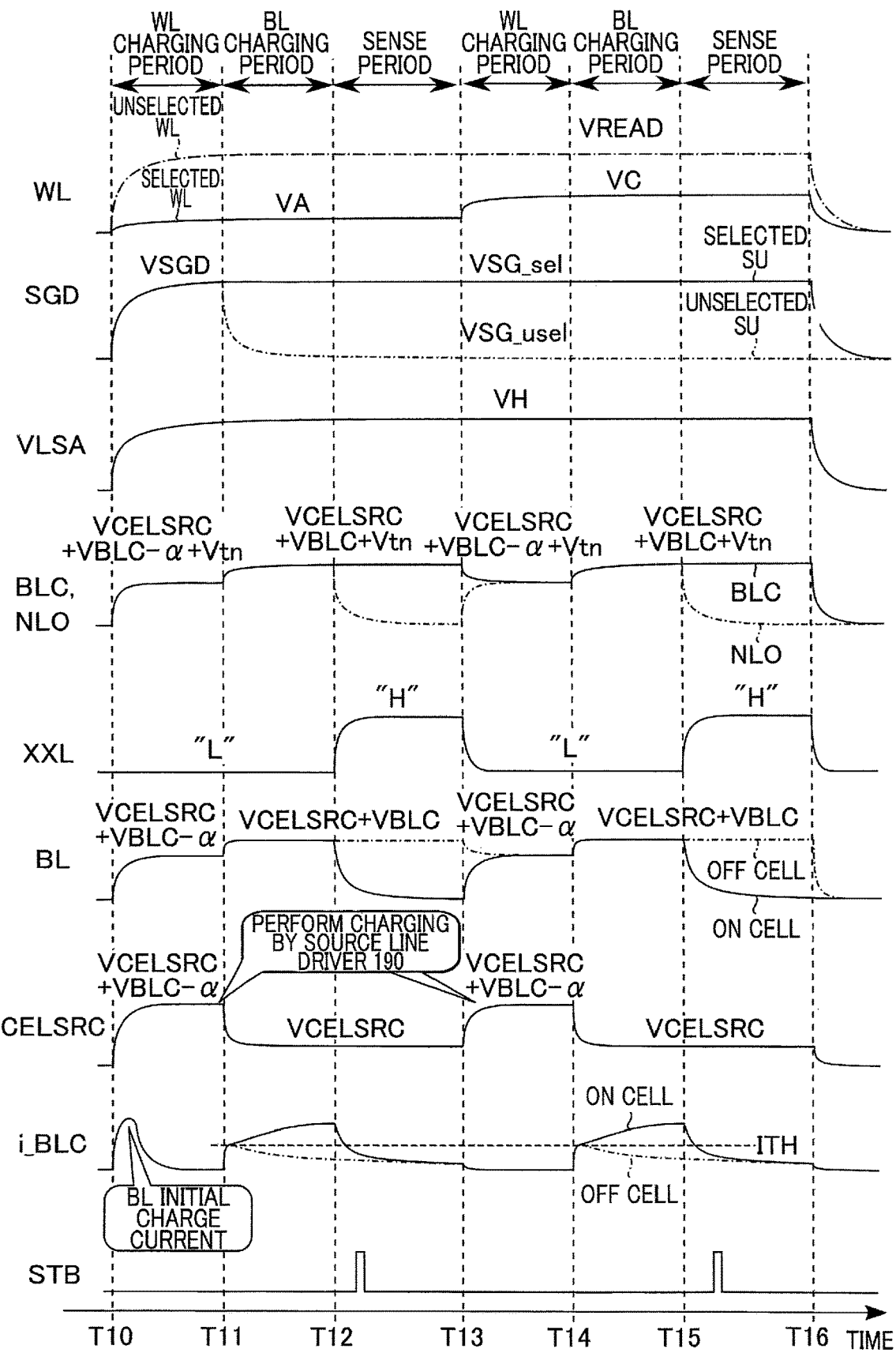
FIG. 10 is a timing chart to explain an upper page read operation in the semiconductor memory device of the second embodiment.

Next, the upper page read operation will be described with reference to FIG. 10. FIG. 10 is an example of a timing chart to explain an upper page read operation in the semiconductor memory device of the second embodiment. FIG. 10 corresponds to FIG. 8 referred to in connection with the first embodiment.

First, in the period from time T10 to T12, the read operation AR is performed. The read operation AR is similar to the lower page read operation (that is, the read operation BR) described with reference to T1 to T3 in FIG. 9, except that the voltage VA is applied to selected word line WL. Therefore, details of the operation performed in the period from T10 to T12 will be omitted.

When the sense period of the read operation AR finishes, the WL charging period of the read operation CR subsequently starts.

At time T13, the row decoder 120 applies the read voltage VC to the selected word line WL. As a result, the memory cell transistors MT connected to the selected word line WL are in the on state when the threshold voltage is lower than voltage VC (on cell), and are in the off state when the threshold voltage is equal to or higher than voltage VC (off cell).

The sense amplifier SA supplies the voltage (VCELSRC+VBLC−α+Vtn) to the nodes BLC and NLO to turn on both the transistors Tr1 and Tr2, and supplies an "L" level voltage to the node XXL to turn off the transistor Tr6. Thereby, the voltage transferred from node VLSA via Tr2 and Tr1 is clamped to the voltage (VCELSRC+VBLC−α), and the bit line BL is charged to the voltage (VCELSRC+VBLC−α).

On the other hand, the source line driver 190 applies the voltage (VCELSRC+VBLC−α) to the source line CELSRC. Thus, the source line CELSRC is charged to the same voltage as the bit line BL, independently of the bit line BL.

In this manner, in the WL charging period of the read operation CR, the bit line BL and the source line CELSRC are charged to voltages equal to each other, and therefore, almost no current flows between the bit line BL and the source line CELSRC, as in the WL charging period of the read operation AR. As the bit line BL is charged to the voltage (VCELSRC+VBLC−α), the parasitic capacitance Cp becomes "0" with respect to the voltage (VCELSRC+VBLC−α). Since the bit line BL is charged to the voltage (VCELSRC+VBLC) in the read operation AR, the BL initial charge current in the WL charging period of the read operation CR is smaller than the BL initial charge current in the WL charging period of the read operation AR.

By the operation described above, the WL charging period of the read operation CR finishes.

The BL charging period and sense period of the read operation CR are similar to those of the read operation BR described with reference to T2 to T3 in FIG. 9 and to those of the read operation AR described with reference to T11 to T12 in FIG. 10, except that the voltage VC is applied to selected word line WL. Therefore, details of the operation performed in the period from T14 to T15 will be omitted.

Thus, the upper page read operation finishes.

2.3 Advantages of Present Embodiment

According to the second embodiment, in the WL charging period, the sense amplifier SA applies voltage (VCELSRC+VBLC−α+Vtn) to nodes BLC and NLO. The bit line driver 180 applies voltage VH to node VLSA. Thus, transistor Tr1 clamps the voltage of node VLSA to voltage (VCELSRC+VBLC−α) and transfers it to the bit line BL. Therefore, the voltage of the bit line BL can be charged while maintaining the dependency on the threshold voltage Vtn of transistor Tr1.

3. Third Embodiment

Next, a semiconductor memory device according to a third embodiment will be described. Configurations and operations of the third embodiment are similar to those of the first embodiment in that the voltage of the bit line BL is charged independently of the threshold voltage Vtn of the transistor Tr1. The third embodiment differs from the first embodiment in that during the WL charging period, the source line CELSRC is electrically disconnected from the source line driver 190 and is charged to the same voltage as the bit line BL. In the description below, configurations and operations similar to those of the first embodiment will be omitted, and mainly configurations and operations different from those of the first embodiment will be described.

3.1 Lower Page Read Operation

First, the lower page read operation will be described with reference to FIG. 11. FIG. 11 is an example of a timing chart to explain a lower page read operation in the semiconductor memory device of the third embodiment. FIG. 11 corresponds to FIG. 7 referred to in connection with the first embodiment.

As shown in FIG. 11, at time T1, the row decoder 120 applies the voltage VREAD to all word lines WL. In addition, the row decoder 120 applies the voltage VSGD to select gate line SGD of the selected string unit SU, and applies voltage VSG_usel to select gate lines SGD of the unselected string units SU. Although not shown in FIG. 11, the row decoder 120 applies the voltage VSGS to select gate line SGS.

As a result, all the memory cell transistors MT connected to all word lines WL are turned on. In addition, select transistors ST1 and ST2 of the unselected string units SU are turned off and on, respectively. Although the example shown in. FIG. 11 illustrates a case where select transistor ST1 of the selected string unit SU is turned on, this case is not restrictive. That is, in the WL charging period, the on/off state of select transistor ST1 of the selected string unit SU is optionally determined, and select transistor ST1 may be in the off state.

In the WL charging period, initial charging of bit line BL is performed in parallel. Specifically, the bit line driver 180 applies the voltage (VCELSRC+VELC−α) to the node VLSA.

The sense amplifier SA supplies the voltage (VCELSRC+VBLC+Vtn) to the nodes BLC and NLO to turn on the transistors Tr1 and Tr2, and supplies an "L" level voltage to the node XXL to turn off tge transistor Tr6. Thereby, the bit line BL is charged by the voltage (VCELSRC+VBLC−α) of the node VLSA through the transistor Tr2.

On the other hand, the source line CELSRC is electrically disconnected from the source line driver 190. Since the select transistors ST1 of the unselected string units SU are in the off state, as described above, the source line CELSRC is also substantially in a floating state with respect to the bit line BL. In a case where the select transistor ST1 of the selected string unit SU is in the on state, the selected string unit SU can electrically connect the bit line BL and the source line CELSRC to each other in response to the on/off operation of the selected memory cell transistor MT. However, since the conduction path using such a selected string unit SU is negligible as compared with the conduction path capable of charging the source line CELSRC, the source line CELSRC can be regarded as being substantially floating.

As shown in FIG. 3, the bit line BL and the source line CELSRC are both arranged above the NAND string NS. With this configuration, the source line CELSRC may be charged to an equivalent potential level by coupling when the bit line BL is charged.

At this time, the transistor Tr_SRC configured to electrically connect the source line CELSRC to the ground is adjusted such that unnecessary electrons leak to such an extent that potential of the source line CELSRC does not discharge to the ground potential. Thereby, transistor Tr_SRC can function as a path for discharging unnecessary electrons in the unselected string units SU to the ground.

In this manner, in the WL charging period, the bit line BL and the source line CELSRC are electrically disconnected, and therefore, almost no current flows between the bit line BL and the source line CELSRC. As described above, however, the parasitic capacitance Cp is present between a plurality of bit lines BL. Therefore, as the bit line BL is charged to the voltage (VCELSRC+VBLC−α), a BL initial charge current flows into the bit line BL, so that the parasitic capacitance Cp becomes "0" with respect to the voltage (VCELSRC+VBLC−α). The BL initial charge current stops flowing when the charging of the parasitic capacitance Cp is completed.

At time T2, the row decoder 120 applies the voltage VB to the selected word line WL. As a result, the memory cell transistors MT connected to the selected word line WL are in the on state when the threshold voltage is lower than voltage VB (on cell), and are in the off state when the threshold voltage is equal to or higher than voltage VB (off cell).

The other operations in the BL charging period and the operation in the sense period are similar to the operations from time T2 to T4 of FIG. 7 referred to in connection with the first embodiment, and thus a description thereof will be omitted.

In this manner, the lower page read operation finishes.

3.2 Upper Page Read Operation

Figure 12:
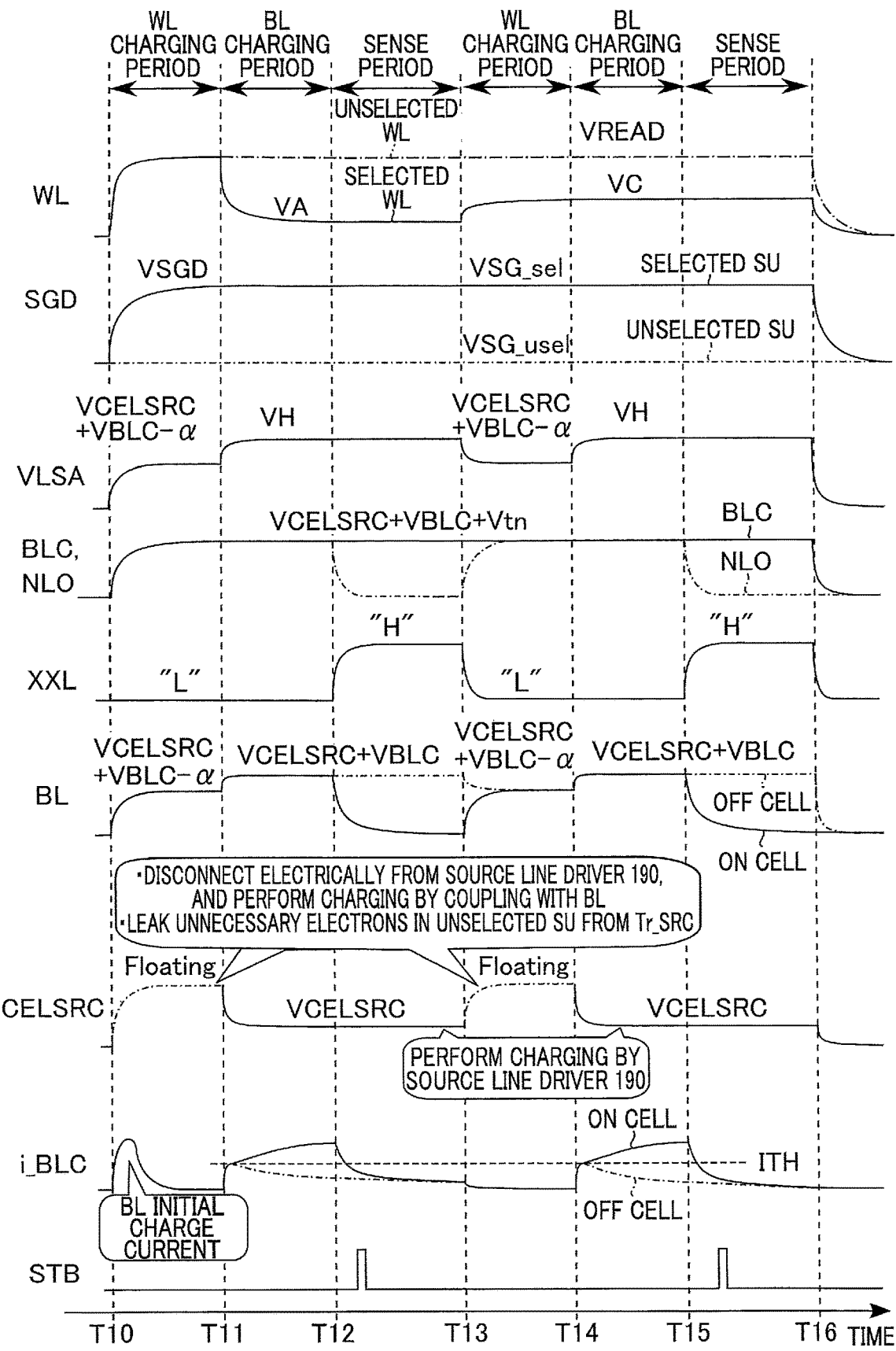
FIG. 12 is a timing chart to explain an upper page read operation in the semiconductor memory device of the third embodiment.

Next, the upper page read operation will be described with reference to FIG. 12. FIG. 12 is an example of a timing chart to explain an upper page read operation in the semiconductor memory device of the third embodiment. FIG. 12 corresponds to FIG. 8 referred to in connection with the first embodiment, and each of the read operations AR and CR includes a WL charging period, a BL charging period and a sense period.

First, in the period from time T10 to T12, the read operation AR is performed. The read operation AR is similar to the lower page read operation (that is, the read operation BR) described with reference to T1 to T3 in FIG. 11, except that the voltage VA is applied to selected word line WL. Therefore, details of the operation performed in the period from T10 to T12 will be omitted.

When the sense period of the read operation AR finishes, the WL charging period of the read operation CR subsequently starts.

At time T13, the row decoder 120 applies the read voltage VC to the selected word line WL. As a result, the memory cell transistors MT connected to the selected word line WL are in the on state when the threshold voltage is lower than voltage VC (on cell), and are in the off state when the threshold voltage is equal to or higher than voltage VC (off cell).

In addition, the bit line driver 180 applies the voltage (VCELSRC+VBLC−α) to the node VLSA. The sense amplifier SA supplies the voltage (VCELSRC+VELC+Vtn) to the node NLO to turn on the transistors Tr2, and supplies an "L" level voltage to the node XXL to turn off the transistor Tr6. As a result, the bit line BL is electrically disconnected from the node SEN and is connected to the node VLSA. Thereby, the bit line BL is charged by the voltage (VCELSRC+VBLC−α) of the node VLSA through the transistor Tr2.

On the other hand, the source line CELSRC is electrically disconnected from the source line driver 190. Since the select transistors ST1 of the unselected string units SU are in the off state, as described above, the source line CELSRC is also substantially in a floating state with respect to the bit line BL. With this configuration, the source line CELSRC may be charged to an equivalent potential level by coupling when the bit line BL is charged.

In this manner, in the WL charging period of the read operation CR, the bit line BL and the source line CELSRC are electrically disconnected, and therefore, almost no current flows between the bit line BL and the source line CELSRC, as in the WL charging period of the read operation AR. As the bit line BL is charged to the voltage (VCELSRC+VBLC−α), the parasitic capacitance Cp becomes "0" with respect to the voltage (VCELSRC+VBLC−α). Since the bit line BL is charged to the voltage (VCELSRC+VBLC) in the read operation AR, the BL initial charge current in the WL charging period of the read operation CR is smaller than the BL initial charge current in the WL charging period of the read operation AR.

By the operation described above, the WL charging period of the read operation CR finishes.

The BL charging period and sense period of the read operation CR are similar to those of the read operation BR described with reference to T2 to T3 in FIG. 11 and to those of the read operation AR described with reference to T11 to T12 in FIG. 12, except that voltage VC is applied to selected word line WL. Therefore, details of the operation performed in the period from T14 to T15 will be omitted.

Thus, the upper page read operation finishes.

3.3 Advantages of Present Embodiment

According to the third embodiment, in the WL charging period, the source line CELSRC is electrically disconnected from the source line driver 190, and the select transistors ST1 of the unselected string units SU are turned off. Thus, the source line CELSRC is substantially in a floating state with respect to the bit line BL. Therefore, the source line CELSRC is charged to an equivalent potential level by coupling when the bit line BL is charged to the voltage (VCELSRC+VBLC−α) in the WL charging period. The bit line BL is charged to voltage (VCELSRC+VBLC−α) from the node VLSA. Therefore, the voltage of the bit line BL can be charged up to the load of the threshold current ITH independently of the threshold voltage Vtn of the transistor Tr1, and the same advantages as those of the first embodiment can be obtained.

In addition, the row decoder 120 applies the voltage VREAD to all word lines WL in the WL charging period of the read operation AR. Furthermore, the transistor Tr_SRC is adjusted such that unnecessary electrons can leak to the ground while maintaining the potential of the source line CELSRC. Thus, the unselected string units SU can discharge unnecessary electrons to outside through the source line CELSRC while electrically disconnecting the bit line BL and the source line CELSRC.

4. Fourth Embodiment

Next, a semiconductor memory device according to a fourth embodiment will be described. Configurations and operations of the fourth embodiment are similar to those of the second embodiment in that the voltage of the bit line BL is charged depending on the threshold voltage Vtn of the transistor Tr1. The fourth embodiment differs from the second embodiment in that during the WL charging period, the source line CELSRC is electrically disconnected from the source line driver 190 and is charged to the same voltage as the bit line BL. In the description below, configurations and operations similar to those of the second embodiment will be omitted, and mainly configurations and operations different from those of the second embodiment will be described.

4.1 Lower Page Read Operation

Figure 13:
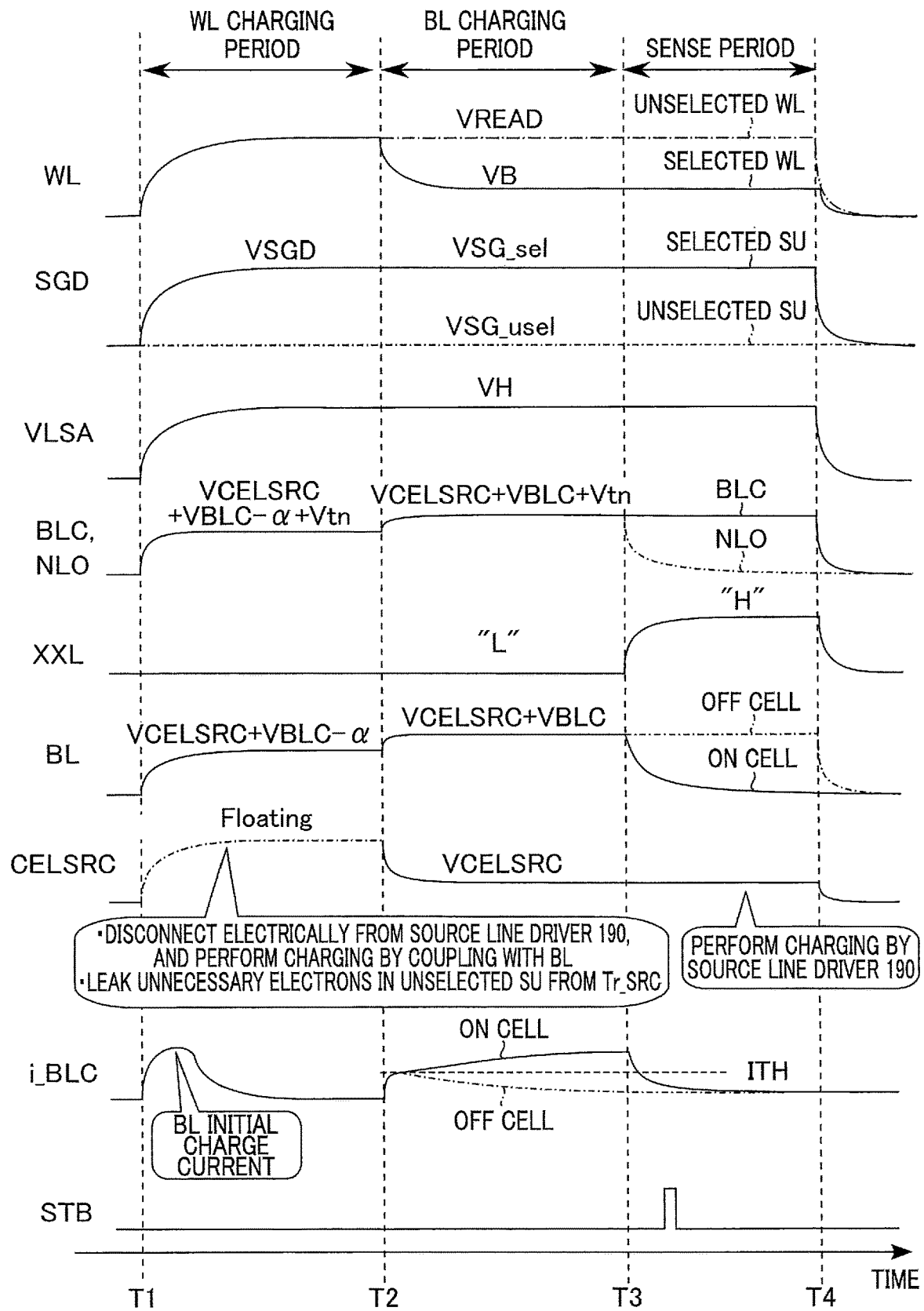
FIG. 13 is a timing chart to explain a lower page read operation in a semiconductor memory device according to a fourth embodiment.

First, the lower page read operation will be described with reference to FIG. 13. FIG. 13 is an example of a timing chart to explain a lower page read operation in the semiconductor memory device of the fourth embodiment. FIG. 13 corresponds to FIG. 9 referred to in connection with the second embodiment.

As shown in FIG. 13, at time T1, the row decoder 120 applies the voltage VREAD to all word lines WL. In addition, the row decoder 120 applies the voltage VSGD to select gate line SGD of the selected string unit SU, and applies voltage VSG_usel to select gate lines SGD of the unselected string units SU. Although not shown in FIG. 13, the row decoder 120 applies the voltage VSGS to select gate line SGS.

As a result, all the memory cell transistors MT connected to all word lines WL are turned on. In addition, the select transistors ST1 and ST2 of the unselected string units are turned off and on, respectively. Although the example shown in FIG. 13 illustrates a case where the select transistor ST1 of the selected string unit SU is turned on, as in the case of the third embodiment shown in FIG. 11, this case is not restrictive. That is, in the WL charging period, the on/off state of the select transistor ST1 of the selected string unit SU is optionally determined, and the select transistor ST1 may be in the off state.

In the WL charging period, initial charging of bit line BL is performed in parallel. Specifically, the bit line driver 180 applies the voltage VH to the node VLSA.

The sense amplifier SA supplies the voltage (VCELSRC+VBLC−α+Vtn) to the nodes DLC and NLO to turn on the transistors Tr1 and Tr2, and supplies an "L" level voltage to the node XXL to turn off the transistor Tr6. Thereby, the voltage VH of node VLSA is clamped to the voltage (VCELSRC+VBLC−α) by the transistor Tr1 and is supplied to the bit line BL.

On the other hand, the source line CELSRC is electrically disconnected from the source line driver 190. Since the select transistors ST1 of the unselected string units SU are in the off state, as described above, the source line CELSRC is also substantially in a floating state with respect to the bit line BL. With this configuration, the source line CELSRC may be charged to an equivalent potential level by coupling when the bit line BL is charged.

At this time, the transistor Tr_SRC, which connects the source line CELSRC to the ground, is adjusted such that unnecessary electrons leak to such an extent that potential of the source line CELSRC does not discharge to the ground potential. Thereby, the transistor Tr_SRC can function as a path for discharging unnecessary electrons in the unselected string units SU to the ground.

In this manner, in the WL charging period, the bit line BL and the source line CELSRC are electrically disconnected, and therefore, almost no current flows between the bit line BL and the source line CELSRC. As described above, however, the parasitic capacitance Cp is present between a plurality of bit lines BL. Therefore, as the bit line BL is charged to the voltage (VCELSRC+VBLC−α), a BL initial charge current flows into the bit line BL, so that the parasitic capacitance. Cp becomes "0" with respect to the voltage (VCELSRC+VBLC−α). The BL initial charge current stops flowing when the charging of the parasitic capacitance Cp is completed.

At time T2, the row decoder 120 applies the voltage VB to the selected word line WL. As a result, the memory cell transistors MT connected to the selected word line WL are in the on state when the threshold voltage is lower than voltage VB (on cell), and are in the off state when the threshold voltage is equal to or higher than voltage VB (off cell).

The other operations in the BL charging period and the operation in the sense period are similar to the operations from time T2 to T4 of FIG. 9 referred to in connection with the second embodiment, and thus a description thereof will be omitted.

In this manner, the lower page read operation finishes.

4.2 Upper Page Read Operation

Figure 14:
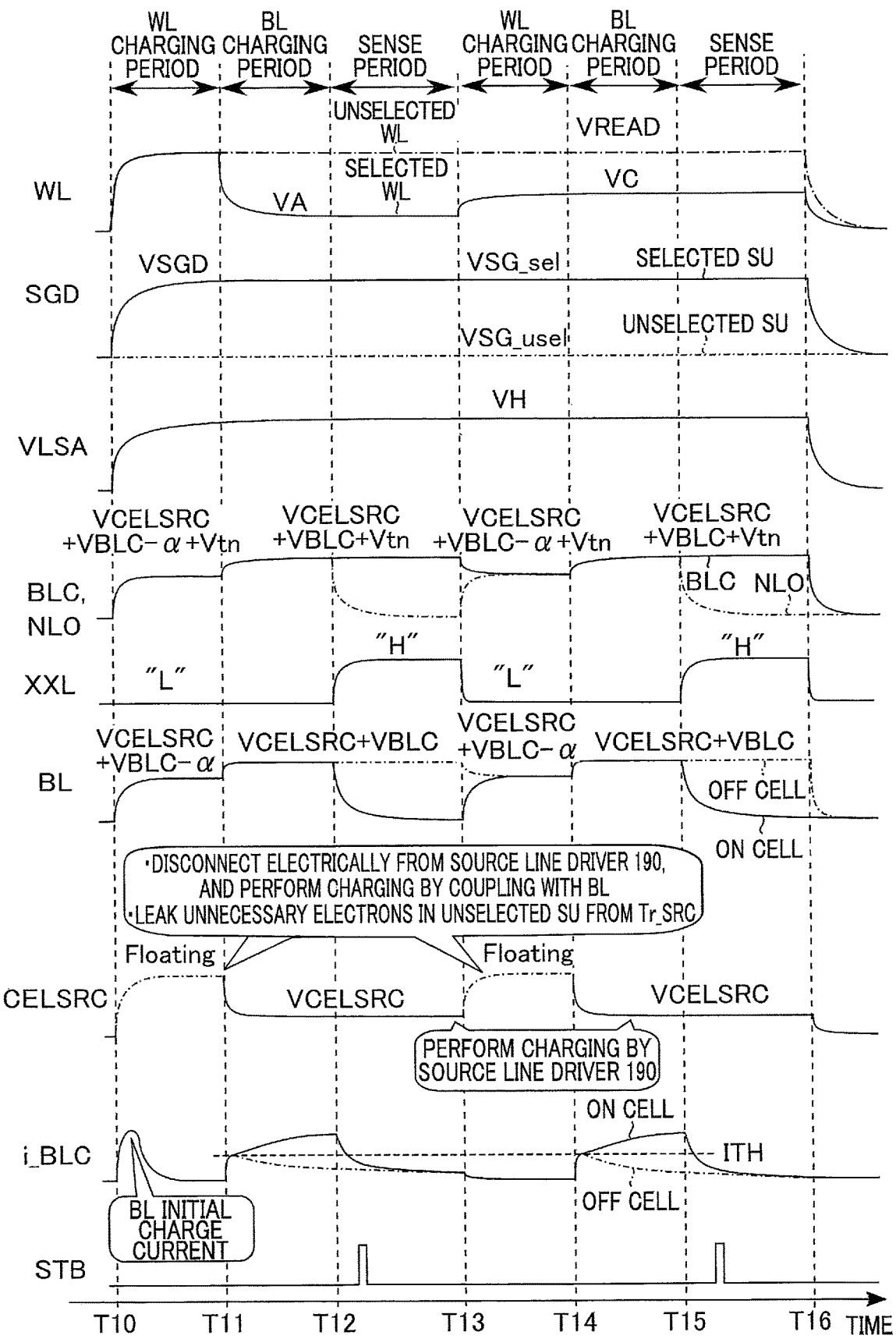
FIG. 14 is a timing chart to explain an upper page read operation in the semiconductor memory device of the fourth embodiment.

Next, the upper page read operation will be described with reference to FIG. 14. FIG. 14 is an example of a timing chart to explain an upper page read operation in the semiconductor memory device of the fourth embodiment. FIG. 14 corresponds to FIG. 10 referred to in connection with the second embodiment, and each of read operations AR and CR includes a WL charging period, a BL charging period and a sense period.

First, in the period from time T10 to T12, the read operation AR is performed. Read operation AR is similar to the lower page read operation (that is, the read operation BR) described with reference to T1 to T3 in FIG. 13, except that the voltage VA is applied to selected word line WL. Therefore, details of the operation performed in the period from T10 to T12 will be omitted.

When the sense period of the read operation AR finishes, the WL charging period of the read operation CR subsequently starts.

At time T13, the row decoder 120 applies the read voltage VC to the selected word line WL. As a result, the memory cell transistors MT connected to the selected word line WL are in the on state when the threshold voltage is lower than voltage VC (on cell), and are in the off state when the threshold voltage is equal to or higher than voltage VC (off cell).

The sense amplifier SA supplies the voltage (VCELSRC+VBLC−α+Vtn) to the nodes BLC and NLO to turn on both the transistors Tr1 and Tr2, and supplies an "L" level voltage to the node XXL to turn off the transistor Tr6. Thereby, the voltage transferred from node VLSA via Tr2 and Tr1 is clamped to the voltage (VCELSRC+VBLC−α), and the bit line BL is charged to the voltage (VCELSRC+VBLC−α).

On the other hand, the source line CELSRC is electrically disconnected from the source line driver 190. Since the select transistors ST1 of the unselected string units SU are in the off state, as described above, the source line CELSRC is also substantially in a floating state with respect to the bit line BL. With this configuration, the source line CELSRC may be charged to an equivalent potential level by coupling when the bit line BL is charged.

In this manner, in the WL charging period of the read operation CR, the bit line BL and the source line CELSRC are electrically disconnected, and therefore, almost no current flows between the bit line BL and the source line CELSRC, as in the WL charging period of the read operation AR. As the bit line BL is charged to the voltage (VCELSRC+VBLC−α), the parasitic capacitance Cp becomes "0" with respect to the voltage (VCELSRC+VBLC−α). Since the bit line BL is charged to the voltage (VCELSRC+VBLC) in the read operation AR, the BL initial charge current in the WL charging period of the read operation CR is smaller than the BL initial charge current in the WL charging period of the read operation AR.

By the operation described above, the WL charging period of the read operation CR finishes.

The BL charging period and sense period of the read operation CR are similar to those of the read operation BR described with reference to T2 to T3 in FIG. 13 and to those of the read operation AR described with reference to T11 to T12 in FIG. 14, except that the voltage VC is applied to selected word line WL. Therefore, details of the operation performed in the period from T14 to T15 will be omitted.

Thus, the upper page read operation finishes.

4.3 Advantages of Present Embodiment

According to the fourth embodiment, in the WL charging period, the source line CELSRC is electrically disconnected from the source line driver 190, and the select transistors ST1 of the unselected string units SU are turned off, as in the third embodiment. Thus, the source line CELSRC is substantially in a floating state with respect to the bit line BL. Therefore, the source line CELSRC is charged to an equivalent potential level by coupling when the bit line BL is charged to the voltage (VCELSRC+VBLC−α) in the WL charging period. The sense amplifier SA applies the voltage (VCELSRC+VELC−α+Vtn) to the nodes BLC and NLO. The bit line driver 180 applies the voltage VH to the node VLSA. Thus, the transistor Tr1 clamps the voltage of the node VLSA to the voltage (VCELSRC+VBLC−α) and transfers it to the bit line BL. Therefore, the voltage of the bit line BL can be charged up to the load of the threshold current ITH while maintaining the dependency on the threshold voltage Vtn of the transistor Tr1, and the same advantages as those of the second embodiment can be obtained.

5. Others

Although several embodiments have been described, the first, second, third and fourth embodiments described above are not restrictive, and various modifications are applicable.

For example, in connection with each of the embodiments described above, a case where the memory cell transistor MT can store 2-bit data (MLC: Multi level cell) is described, but this is not restrictive. For example, the embodiments described above are applicable to a case where the memory cell transistor MT can store 3-bit data (TLC: Triple level cell) and to a case where the memory cell transistor MT can store more bits. Further, even in a case where one bit of data can be stored in the memory cell transistor MT (SLC: Single level cell), cases shown in FIGS. 7, 9, 11, and 13 are applicable.

In connection with each of the above-described embodiments, a case where the read operation CR is executed in succession to the read operation AR in the upper page read operation is described. However, this is not restrictive. For example, in the upper page read operation, the read operation AR may be executed in succession to the read operation CR. To this case as well, the cases shown in FIG. 8, FIG. 10, FIG. 12 and FIG. 14 are applicable by switching the voltage applied to the selected word line WL.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device comprising:
a first memory cell transistor;
a bit line electrically connected to a first end of the first memory cell transistor;
a source line electrically connected to a second end of the first memory cell transistor; and
a control circuit,
wherein
when a read operation for reading read data from the first memory cell transistor is performed, the control circuit is configured to
apply a first voltage to the bit line in a first period,
apply a second voltage, higher than the first voltage, to the bit line in a second period subsequent to the first period, and also apply a third voltage, lower than the first voltage, to the source line, in the second period subsequent to the first period, and
sense a threshold voltage of the first memory cell transistor in a third period subsequent to the second period,
wherein the control circuit is further configured to apply the first voltage to the source line in the first period, and
wherein the control circuit includes
a first driver, and
a first transistor having a first threshold voltage and including a first end electrically connected to the first end of the first memory cell transistor via the bit line, and a second end electrically connected to the first driver, and
in the first period, the control circuit is further configured to
apply a sum of the second voltage and the first threshold voltage to a gate of the first transistor, and
apply the first voltage driven by the first driver to the bit line via the first transistor.

2. The semiconductor memory device according to claim 1, wherein
the control circuit includes
a first driver, and
a first transistor having a first threshold voltage and including a first end electrically connected to the first end of the first memory cell transistor via the bit line, and a second end electrically connected to the first driver, and
in the first period, the control circuit is further configured to
apply a sum of the first voltage and the first threshold voltage to a gate of the first transistor, and
cause the first transistor to clamp a voltage driven by the first driver to the first voltage and apply the first voltage to the bit line.

3. The semiconductor memory device according to claim 1, further comprising:
a second transistor configured to electrically connect between the first end of the first memory cell transistor and the bit line;
a second memory cell transistor including a first end electrically connected to the bit line, a second end electrically connected to the source line, and a gate electrically connected to a word line electrically connected to a gate of the first memory cell transistor; and
a third transistor configured to electrically connect between the first end of the second memory cell transistor and the bit line,
wherein the control circuit is further configured to turn off the third transistor in the first period.

4. The semiconductor memory device according to claim 3, further comprising:
a fourth transistor configured to electrically connect between the second end of the second memory cell transistor and the source line,
wherein the control circuit is further configured to turn on the fourth transistor in the first period.

5. The semiconductor memory device according to claim 4, wherein the control circuit is further configured to cause the source line to be in a floating state in the first period.

6. The semiconductor memory device according to claim 5, wherein
the control circuit includes
a first driver, and
a first transistor having a first threshold voltage and including a first end electrically connected to the first end of the first memory cell transistor via the bit line, and a second end electrically connected to the first driver, and
in the first period, the control circuit is further configured to
apply a sum of the second voltage and the first threshold voltage to a gate of the first transistor, and
apply the first voltage driven by the first driver to the bit line via the first transistor.

7. The semiconductor memory device according to claim 5, wherein
the control circuit includes
a first driver, and
a first transistor having a first threshold voltage and including a first end electrically connected to the first end of the first memory cell transistor via the bit line, and a second end electrically connected to the first driver, and
in the first period, the control circuit is further configured to
apply a sum of the first voltage and the first threshold voltage to a gate of the first transistor, and
cause the first transistor to clamp a voltage driven by the first driver to the first voltage and apply the first voltage to the bit line.

8. The semiconductor memory device according to claim 1, wherein
the first memory cell transistor is configured to store data of 2 bits or more, and
the control circuit is further configured to
sense the threshold voltage of the first memory cell transistor by use of a first read voltage in the third period,
apply the first voltage to the bit line in a fourth period subsequent to the third period,
apply the second voltage to the bit line and also apply the third voltage to the source line, in a fifth period subsequent to the fourth period, and
sense the threshold voltage of the first memory cell transistor by use of a second read voltage in a sixth period subsequent to the fifth period.

9. The semiconductor memory device according to claim 8, wherein
the control circuit is further configured to apply the first voltage to the source line in the first period and the fourth period.

10. The semiconductor memory device according to claim 9, wherein
the control circuit includes
a first driver, and
a first transistor having a first threshold voltage and including a first end electrically connected to the first end of the first memory cell transistor via the bit line, and a second end electrically connected to the first driver, and
in the first period and the fourth period, the control circuit is further configured to
apply a sum of the second voltage and the first threshold voltage to a gate of the first transistor, and
apply the first voltage driven by the first driver to the bit line via the first transistor.

11. The semiconductor memory device according to claim 9, wherein
the control circuit includes
a first driver, and
a first transistor having a first threshold voltage and including a first end electrically connected to the first end of the first memory cell transistor via the bit line, and a second end electrically connected to the first driver, and
in the first period and the fourth period, the control circuit is further configured to
apply a sum of the first voltage and the first threshold voltage to a gate of the first transistor, and
cause the first transistor to clamp a voltage driven by the first driver to the first voltage and apply the first voltage to the bit line.

12. The semiconductor memory device according to claim 8, further comprising:
a second transistor configured to electrically connect between the first end of the first memory cell transistor and the bit line;
a second memory cell transistor including a first end electrically connected to the bit line, a second end electrically connected to the source line, and a gate electrically connected to a word line electrically connected to a gate of the first memory cell transistor; and
a third transistor configured to electrically connect between the first end of the second memory cell transistor and the bit line, and
wherein the control circuit is further configured to turn off the third transistor in the first period and the fourth period.

13. The semiconductor memory device according to claim 12, further comprising:
a fourth transistor configured to electrically connect between the second end of the second memory cell transistor and the source line, and
wherein the control circuit is further configured to turn on the fourth transistor in the first period and the fourth period.

14. The semiconductor memory device according to claim 13, wherein the control circuit is further configured to cause the source line to be in a floating state in the first period and the fourth period.

15. The semiconductor memory device according to claim 14, wherein
the control circuit includes
a first driver, and
a first transistor having a first threshold voltage and including a first end electrically connected to the first end of the first memory cell transistor via the bit line, and a second end electrically connected to the first driver, and
in the first period and the fourth period, the control circuit is further configured to:
apply a sum of the second voltage and the first threshold voltage to a gate of the first transistor; and
apply the first voltage driven by the first driver to the bit line via the first transistor.

16. The semiconductor memory device according to claim 14, wherein
the control circuit includes
a first driver, and
a first transistor having a first threshold voltage and including a first end electrically connected to the first end of the first memory cell transistor via the bit line, and a second end electrically connected to the first driver, and
in the first period and the fourth period, the control circuit is further configured to:
apply a sum of the first voltage and the first threshold voltage to a gate of the first transistor; and
cause the first transistor to clamp a voltage driven by the first driver to the first voltage and apply the first voltage to the bit line.

* * * * *